US011290093B1

(12) United States Patent
Chakraborty et al.

(10) Patent No.: US 11,290,093 B1
(45) Date of Patent: Mar. 29, 2022

(54) COMPACT DELAY LINES AND ASSOCIATED CIRCUITRY USEFUL FOR WIDEBAND PHASED-ARRAY SYSTEM

(71) Applicant: International Business Machines Corporation, Armonk, NY (US)

(72) Inventors: Sudipto Chakraborty, Plano, TX (US); Bodhisatwa Sadhu, Peekskill, NY (US); Wooram Lee, Briarcliff Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/229,181

(22) Filed: Apr. 13, 2021

(51) Int. Cl.
*H03K 5/13* (2014.01)
*H03K 5/01* (2006.01)
*H01Q 3/34* (2006.01)
*H03K 5/00* (2006.01)

(52) U.S. Cl.
CPC ............... *H03K 5/01* (2013.01); *H01Q 3/34* (2013.01); *H03K 2005/00019* (2013.01)

(58) Field of Classification Search
CPC ... H03K 5/01; H03K 2005/00019; H01Q 3/34
USPC ........................................................ 327/270
See application file for complete search history.

(56) References Cited

U.S. PATENT DOCUMENTS

| | | | | |
|---|---|---|---|---|
| 7,830,312 | B2* | 11/2010 | Choudhury | H04B 7/0682 343/700 MS |
| 9,124,228 | B2* | 9/2015 | Xu | H03F 3/72 |
| 9,866,293 | B1* | 1/2018 | Da Silva | H04B 7/0695 |
| 10,355,762 | B2* | 7/2019 | Kim | H04B 7/0617 |
| 10,535,923 | B2* | 1/2020 | Black | H01Q 21/0006 |
| 10,666,203 | B2* | 5/2020 | Lee | H03F 1/34 |
| 2013/0328633 | A1* | 12/2013 | Zhang | H03B 5/1218 331/34 |

(Continued)

FOREIGN PATENT DOCUMENTS

| | | | |
|---|---|---|---|
| KR | 20140125615 A | | 10/2014 |
| WO | 2015178979 A2 | | 11/2015 |

OTHER PUBLICATIONS

Hashemi, Mohammad Reza M., et al., "Electronically-Controlled Beam-Steering through Vanadium Dioxide Metasurfaces", Scientific Reports, 6:35439, 2016, 8 pages.

(Continued)

*Primary Examiner* — Ryan Jager
(74) *Attorney, Agent, or Firm* — Harrington & Smith

(57) ABSTRACT

A phased array system includes tunable delay elements having active delay element(s) and passive delay element(s). A second resolution by the passive delay element is smaller than a first resolution by the active delay element, and the resolution corresponds to delay applied to an input signal and has discrete steps for phase over which the delay element can be operated. For multiple sets of tunable delay elements, a calibration process sets, for one set of the delay elements, all but an n-th active delay element and the passive delay element to a first phase, and the n-th active delay element to a second phase. In a second set of the delay elements, all of the active delay elements are set to the first phase and the passive delay element is set to the second phase. A phase difference is detected and adjusted to meet a criterion between the two sets.

25 Claims, 18 Drawing Sheets

(56) References Cited

U.S. PATENT DOCUMENTS

| | | | | |
|---|---|---|---|---|
| 2014/0159815 A1* | 6/2014 | Cai | ............... | H03F 3/45475 330/260 |
| 2020/0059220 A1* | 2/2020 | El-Hinnawy | ............ | H01Q 3/44 |

OTHER PUBLICATIONS

De Galarreta, Carlotta Ruiz, et al., "Phase-Change Metasurfaces for Dyamic Beam Steering and Beam Shaping in the Infrared", 2018 IEEE International Symposium on Circuits and Systems (ISCAS), May 2018, 5 pages.

Garakoui, Seye Kasra, et al., "Phased-Array Antenna Beam Squinting Related to Frequency Dependency of Delay Circuits", 2011 8th European Radar Conference, 2011, 4 pages.

Lee, Wooram, et al., "Tunable Delay Line Using Distributed Inductive/ Capacitive Miller Effect", 2018 IEEE/MITT-S International Microwave Symposium-IMS, 2018, pp. 1445-1448.

Jang, Sunmin, et al., "A 1-GHz 16-Element Four-Beam True-Time-Delay Digital Beamformer", IEEE Journal of Solid-State Circuits, vol. 54, No. 5, May 2019, pp. 1304-1314.

Roderick, Jonathan, et al., "Silicon-Based Ultra-Wideband Beam-Forming", IEEE Journal of Solid-State Circuits, vol. 41, No. 8, Aug. 2006, pp. 1726-1739.

Larocca, Tim, et al., "Milimeter-Wave CMOS Digital Controlled Artificial Dielectric Differential Mode Transmission Lines for Reconfigurable ICs", 2008 IEEE MITT-S International Microwave Symposium Digest, 2008, pp. 181-184.

Woods, Wayne H., et al., "CMOS Millimeter Wave Phase Shifter Based on Tunable Transmission Lines", Proceedings of the IEEE 2013 Custom Integrated Circuits Conference, 2013, 4 pages.

Garakoui, Seyed Kasra, et al., "Compact Cascadable gm-C Al Pass True Time Delay Cell With Reduced Delay Variation Over Frequency", IEEE Journal of Solid-State Circuits, vol. 50, No. 3, Mar. 2015, pp. 693-703.

Tousi, Yahya, et al., "A Ka-band Digitally-Controlled Phase Shifter with sub-degree Phas Precision", IEEE Radio Frequency Integrated Circuits Symposium, 2016, pp. 356-359.

Natarajan, Arun, et al., "W-Band Dual-Polarization Phased-Array Transceiver Front-End in SiGe BiCMOS", IEEE Transactions On Microwave Theory And Techniques, vol. 63, No. 6, Jun. 2015, 14 pages.

Zhang, Hanxiang et al., "A Microstrip line Reflection-Type Phase Shifter for 60 GHZ Phased Array", IEEE/MTT-S International Microwave Symposium, 2019, pp. 826-829.

* cited by examiner

| Coefficients | Output current | Phase shift |
|---|---|---|
| $\beta=0$, $\alpha=0.5$, AP | $i_{out} \sim 0.5 g_m v_{in}$ | 0 |
| $\beta=1$, $\alpha=-0.5$, AP | $i_{out} \sim 0.5 g_m \left\{ \dfrac{1-g_m sL}{1+g_m sL} \right\} v_{in}$ | $2\tan^{-1}(\omega L g_m)$ |
| $\beta=0.5$, $\alpha=0$, LP | $i_{out} \sim 0.5 g_m \left\{ \dfrac{1}{1+g_m sL} \right\} v_{in}$ | $-\tan^{-1}(\omega L g_m)$ |
| $\beta=-0.5$, $\alpha=0.5$, HP | $i_{out} \sim 0.5 g_m \left\{ \dfrac{g_m sL}{1+g_m sL} \right\} v_{in}$ | $\dfrac{\pi}{2} - \tan^{-1}(\omega L g_m)$ |

FIG. 6

| Coefficients | Output current | Phase shift |
|---|---|---|
| $\beta=0,\ \alpha=0.5$, AP | $i_{out} \sim 0.5 g_m v_{in}$ | 0 |
| $\beta=1,\ \alpha=-1$, AP | $i_{out} \sim 0.5 g_m \left\{\dfrac{1-g_m sL}{1+g_m sL}\right\} v_{in}$ | $-2\tan^{-1}(\omega L g_m)$ |
| $\beta=0.5,\ \alpha=0$, LP | $i_{out} \sim 0.5 g_m \left\{\dfrac{1}{1+g_m sL}\right\} v_{in}$ | $-\tan^{-1}(\omega L g_m)$ |
| $\beta=-0.5,\ \alpha=1$, HP | $i_{out} \sim 0.5 g_m \left\{\dfrac{g_m sL}{1+g_m sL}\right\} v_{in}$ | $\dfrac{\pi}{2} - \tan^{-1}(\omega L g_m)$ |

FIG. 7

| Coefficients | Output current | Phase shift |
|---|---|---|
| $\beta=0, \alpha=0.5$, AP | $i_{out} \sim 0.33 g_m v_{in}$ | $0$ |
| $\beta=0.67, \alpha=1$, AP | $i_{out} \sim 0.33 g_m \left\{ \dfrac{1 - g_m sL}{1 + g_m sL} \right\} v_{in}$ | $-2\tan^{-1}(\omega L g_m)$ |
| $\beta=0.33, \alpha=0$, LP | $i_{out} \sim 0.33 g_m \left\{ \dfrac{1}{1 + g_m sL} \right\} v_{in}$ | $-\tan^{-1}(\omega L g_m)$ |
| $\beta=-0.33, \alpha=1$, HP | $i_{out} \sim 0.33 g_m \left\{ \dfrac{g_m sL}{1 + g_m sL} \right\} v_{in}$ | $\dfrac{\pi}{2} - \tan^{-1}(\omega L g_m)$ |

FIG. 8

COMPACT DELAY LINES AND ASSOCIATED CIRCUITRY USEFUL FOR WIDEBAND PHASED-ARRAY SYSTEM

BACKGROUND

This invention relates generally to communication systems and, more specifically, relates to communication devices with delay lines and phased-array antenna systems.

Fine resolution of a tunable RF (radio frequency) delay line is very important in many applications, such as phased-array radar with beam steering. Most conventional implementations of the RF delay line use multiple switches to change the value of capacitance and inductance along the line. To improve the resolution, the unit size of switch, capacitor, and inductor should decrease. However, there is a limit to the minimum size implementable due to parasitic effects and loss.

A transmission line with tunable elements can be used but leads to dimension comparable to the wavelength of the waveform. Relative to discrete transistors or integrated circuits, there is a cost in size for transmission lines.

Wideband performance can therefore be challenging.

SUMMARY

This section is meant to be exemplary and not meant to be limiting.

In an exemplary embodiment, an apparatus comprises a phased array system. The phased array system comprises a set of tunable delay elements comprising at least one active delay element and at least one passive delay element, wherein the at least one active delay element provides a first resolution, and the at least one passive delay element provides a second resolution. The second resolution is smaller than the first resolution, and the resolution corresponds to delay applied to an input signal by a corresponding one of the active or passive delay elements. The first resolution is a first set of discrete steps for phase over which the at least one active delay element can be operated, the second resolution is a second set of discrete steps for phase over which the at least one passive delay element can be operated. A number of discrete steps in the first set is less than a number of discrete steps in the second set.

Another exemplary embodiment is an apparatus comprising a phased array system and control circuitry. The phased array system, comprises multiple sets of tunable delay elements, the sets comprising at least one active delay element and at least one passive delay element. The at least one active delay element provides a first set of resolutions, and the passive delay element provides a second set of resolutions. A number of the first set is less than a number of the second set. An active delay element comprises the following: first circuitry comprising a first input stage and first scaling factor stage, the first input stage outputting to the first scaling factor stage, wherein the first scaling factor stage adjusts a first scaling factor based on inputs to the first scaling factor stage; second circuitry comprising a second input stage and a second scaling factor stage, the second input stage outputting to the second scaling factor stage, wherein the second scaling factor stage adjusts a first scaling factor based on inputs to the second scaling factor stage; and an adder adding outputs from the first and second scaling factor stages and producing an output for the active delay element, wherein adjusting the inputs to the first and second scaling factor stages selects an individual one of the first set of resolutions. The control circuitry is coupled to the phased array system and is configured to select and set delays for the at least one active delay element, at least by using the inputs to the first and second scaling factor stages, and delays for the at least one passive delay element for the multiple sets of tunable delay elements.

In a further exemplary embodiment, a method, includes performing a calibration process on a phased array system. The phased array system comprises multiple sets of tunable delay elements, the sets comprising at least one active delay element and at least one passive delay element. The at least one active delay element provides a first set of resolutions, and the passive delay element provides a second set of resolutions. A number of the first set is less than a number of the second set. The calibration process includes setting all of the active delay elements except an n-th active delay element in a first one of the sets to a first phase, setting the passive delay element in that set to the first phase, and setting the n-th active delay element in that set to a second phase. The calibration process also includes setting all of the active delay elements in a second one of the sets to the first phase, and setting the passive delay element in that set to the second phase. The calibration process further includes detecting a phase difference between outputs of the first and second sets of tunable delay elements, and adjusting the first and second inputs to the first and second scaling factor stages of the n-th active delay element until the phase difference meets a criterion. The calibration process includes storing one or more codes indicative of the first and second inputs for the n-th active delay element as a calibration point.

BRIEF DESCRIPTION OF THE SEVERAL VIEWS OF THE DRAWINGS

FIG. 1A is a graph of the delay for the circuitry of FIG. 1, and FIG. 1B is a graph of the phase for the circuitry of FIG. 1;

FIG. 6 is a table of scaling factors, output current, and phase shift for all-pass (AP), low-pass (LP), or high-pass (HP) filtering approaches in exemplary embodiments; and FIG. 7 is a table of scaling factors, output current, and phase shift for AP, LP, or HP filtering approaches in exemplary embodiments for variant 1 (*one*) scaling;

FIG. 8 is a table of scaling factors, output current, and phase shift for AP, LP, or HP filtering approaches in exemplary embodiments for variant 2 (*two*) scaling;

FIG. 14A illustrates amplitude and FIG. 14B illustrates phase; FIG. 15A illustrates amplitude and FIG. 15B illustrates phase and group delay.

DETAILED DESCRIPTION

The word "exemplary" is used herein to mean "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims.

As described above, wideband performance can be challenging. The exemplary embodiments address this and other issues by, e.g., in an exemplary embodiment, combining staggered analog (e.g., active) delay cells for coarse phase-shift, and a T-line based fine delay line. This results in lower area and lower power, relative to conventional techniques. Additionally, multiple staggered phase shifter stages can lead to process invariant, wideband performance.

Concerning the staggered analog (e.g., active) delay cells, the term "staggered" refers to the frequency response. That is, if there are N stages in cascade (in the sense that the output of Nth stage is provided to the input of the (N+1)th stage) and the frequency of the maximum gain of the Nth stage is slightly shifted relative to that of the (N+1)th stage, then the combined frequency response of the two stages (in the general sense, N stages), the overall frequency response becomes substantially constant over a wide temperature range.

Thus, the staggering of frequency response makes the overall (cascaded) frequency response nearly constant over a wide frequency range and provides the process invariance. For each process corner, when measuring PVT (process, voltage, temperature), one can adjust the transconductance, $g_m$.

Figure 1:
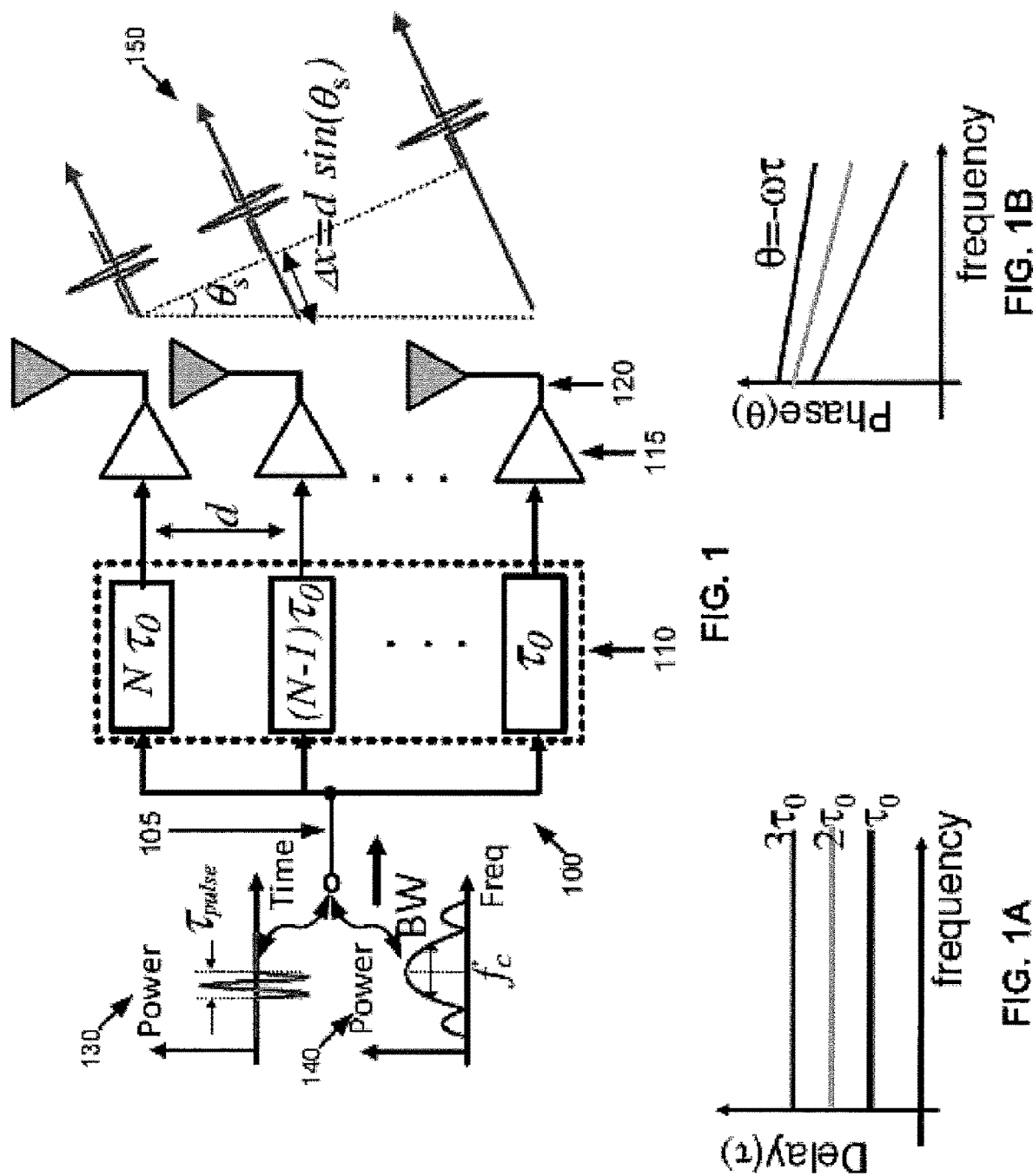
FIG. 1 is a block diagram of circuitry for a broadband timed array with true time delay, and corresponding input and output signals.

Before describing the exemplary embodiments, it is helpful to provide an overview of the technical area in which the exemplary embodiments reside. One such area involves a broadband timed array 100 with true time delay, the circuitry for which is illustrated in FIG. 1. In FIG. 1, there are N time delays 110, illustrated as $\tau_0, \ldots, (N-1)\tau_0, N\tau_0$. There is a distance of d between each corresponding amplifier 115 (of N amplifiers 115) and antenna 120 (of N antennas 120). The input signal 105 is illustrated as having (see reference 130) a signal caused by a $\tau_{pulse}$ in time, with the power being illustrated. This pulse also causes (see reference 140) a power frequency spectrum in frequency that is centered around $f_c$ and having a bandwidth of BW. The output signal 150 from the array of N antennas 120 is illustrated, where the individual signals are offset by $\theta_s$, where $\Delta x = d \sin(\theta_s)$.

As illustrated by FIG. 1A, the delay ($\tau$) that is introduced is a linear multiple of $\tau_0$. FIG. 1B illustrates the phase ($\theta$) is a function of $\theta = -\omega\tau$. Note that the $3\tau_0$ line of FIG. 1A corresponds to the bottom phase curve in FIG. 1B, and the $\tau_0$ curve in FIG. 1A corresponds to the top curve in FIG. 1B.

Figure 2:
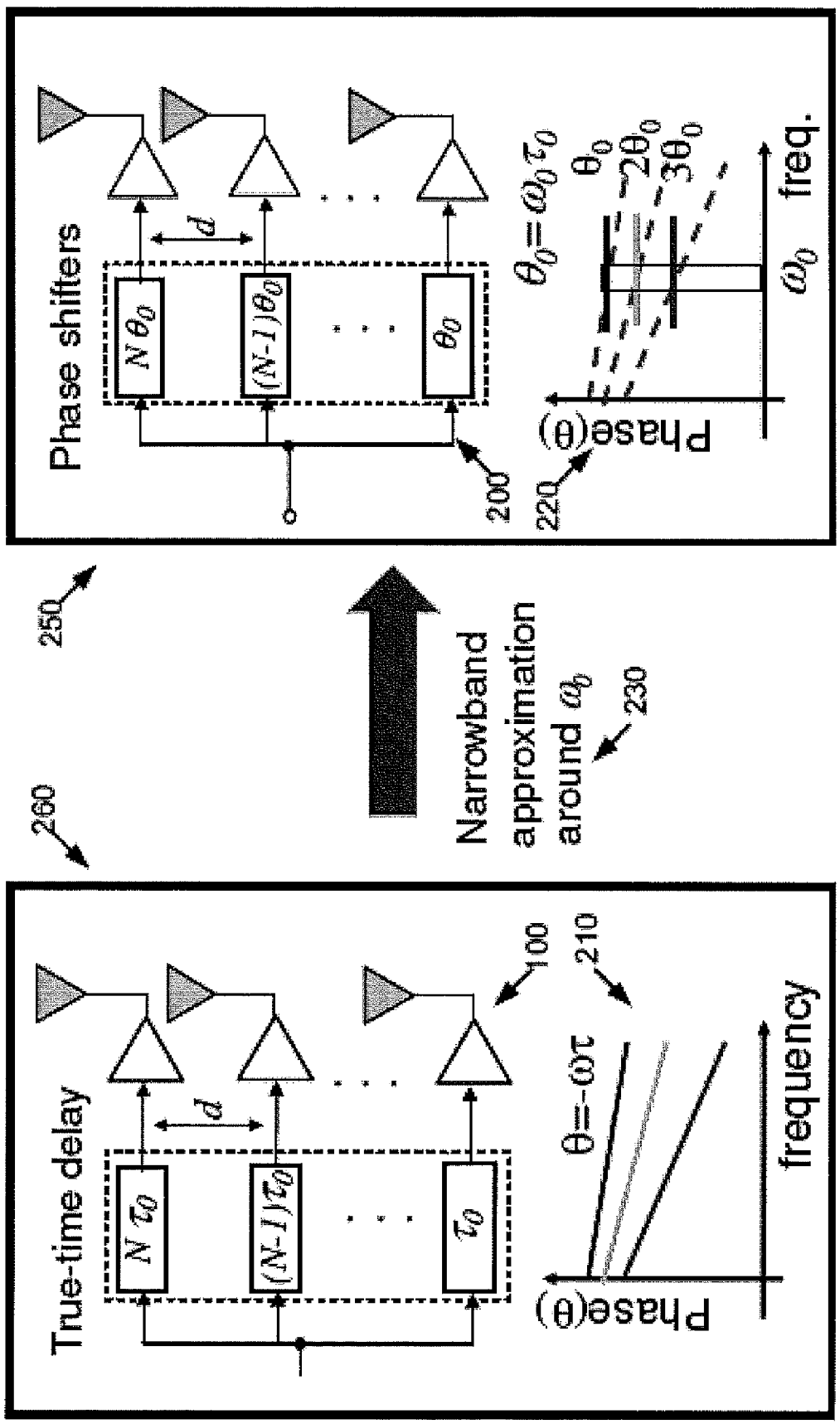
FIG. 2 illustrates how the timed array with true-time delay of FIG. 1 can be approximated by a phased array with narrow-band phase shifters via a narrowband approximation.

The true time delay for the broadband timed array 100 may be a challenge to achieve in practice. One potential way to achieve similar results is through use of a phased-array approximation. Turning to FIG. 2, this figure illustrates how the timed array with true-time delay of FIG. 1 can be approximated by a phased array with narrow-band phase shifters via a narrowband approximation.

The broadband timed array 100 is illustrated in block 260, as is FIG. 1B (see reference 210). As indicated by reference 230, a narrowband approximation around frequency $\omega_0$ is performed, and this results in phased array 200 comprising N phase shifters $\theta_0, \ldots, (N-1)\theta_0, N\theta_0$, instead of N time delays 110 (see FIG. 1, illustrated as $\tau_0, \ldots, (N-1)\tau_0, N\tau_0$). The $\theta_0 = \omega_0\tau_0$ is used and reference 220 indicates that this is a reasonable approximation, when centered around $\theta_0$, of true-time delay.

While the phased array 200 is an attempt at a reasonable approximation of a broadband timed array 100 with a true time delay, these have issues. In particular, there is the phenomena of a non-true-time-delay effect on the phased array. The use of phase shifters without true-time delay property causes beam squinting (see FIG. 3A) and inter-symbol interference (see FIG. 3B), which limits radar signal bandwidth. For beam squinting in FIG. 3A, see Garakoui et al., "Phased-array antenna beam squinting related to frequency dependency of delay circuits", 2011 8th European Radar Conference, Manchester, U K, 2011, pp. 416-419, which states that "Beam squinting, in words, means that an antenna pattern points to $\theta_0 + \Delta\theta$ at frequency $f_0 + \Delta f$ instead of $\theta_0$, which was the pointing direction at frequency $f_0$."

Figure 3B:
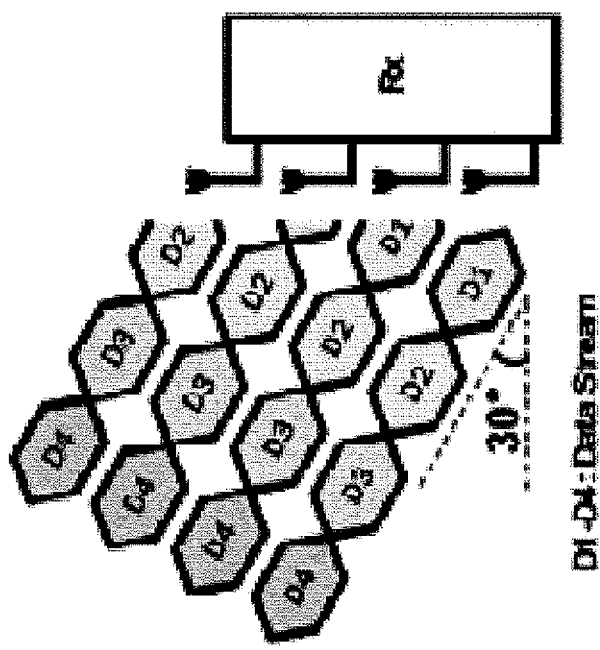
FIG. 3B is an illustration of inter-symbol interference, for a non-true-time-delay effect on a phased array.
Figure 3A:
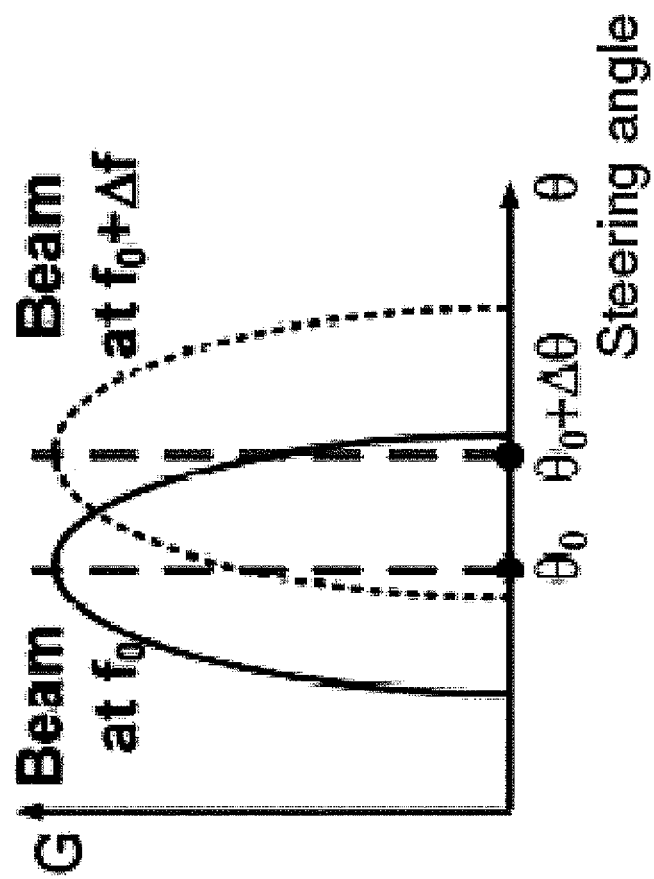
FIG. 3A is an illustration of beam squinting.

For the inter-symbol interference in FIG. 3B, see Jang et al., "A 1-GHz 16-Element Four-Beam True-Time-Delay Digital Beamformer," in IEEE Journal of Solid-State Circuits, vol. 54, no. 5, pp. 1304-1314, May 2019, doi: 10.1109/JSSC.2019.2894357, where FIG. 3B is illustrated there as FIG. 3(a) and the reference says the following: "In FIG. 3(a), D1-D4 represent data symbols. Antenna 1 is receiving D2, while the other antennas are receiving D1. Since D1 and D2 are independent, D2 is merely a distortion of D1, and the performance of the array degrades after beamforming. This phenomenon is called array ISI because a subsequent symbol (D2) interferes with the current symbol (D1)."

There are multiple phase shifter categories. One is a narrow band phase shifter. One example is referred to as RTPS (Reflective Type Phase Shifter), where phase can be controlled continuously with varactors at the reflective end, but the operation bandwidth is limited, and loss variation over control is relatively large. See Arun Natarajan, et al., "W-Band Dual-Polarization Phased-Array Transceiver Front-End in SiGe BiCMOS", IEEE Transactions on Microwave Theory and Techniques, VOL. 63, NO. 6, JUNE 2015. See also Hanxiang Zhang, et al., "A Microstrip line Reflection-Type Phase Shifter for 60 GHz Phased Array", 2019 IEEE/MTT-S International Microwave Symposium. Another is a broadband phase shifter, such as an artificial transmission line with discrete switches. See W. H. Woods, A. Valdes-Garcia, H. Ding and J. Rascoe, "CMOS millimeter wave phase shifter based on tunable transmission lines," Proceedings of the IEEE 2013 Custom Integrated Circuits Conference, San Jose, Calif., USA, 2013, pp. 1-4, doi: 10.1109/CICC.2013.6658442.

Figure 4B:
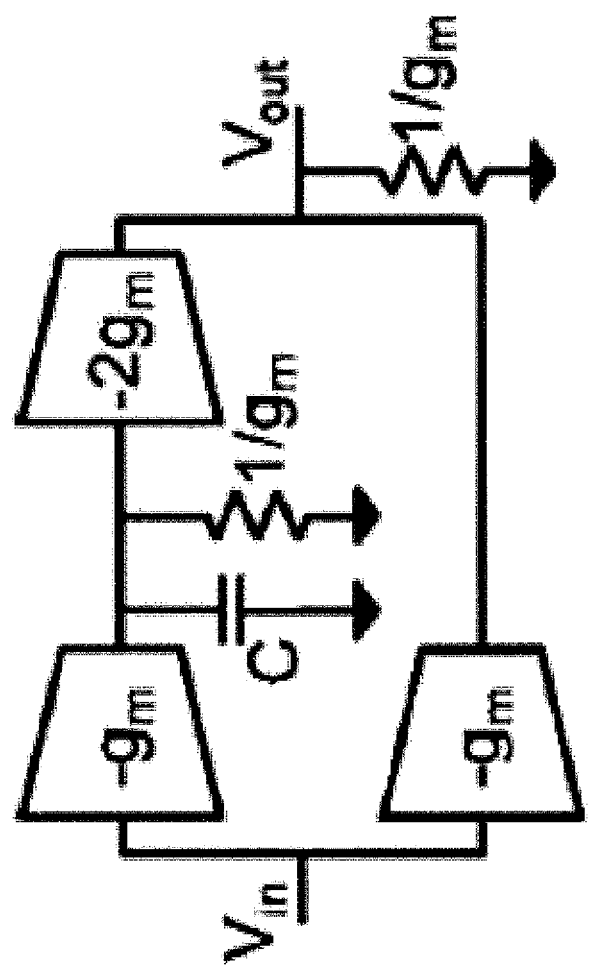
FIG. 4B illustrates an architectural view of the all-pass filter.
Figure 4A:
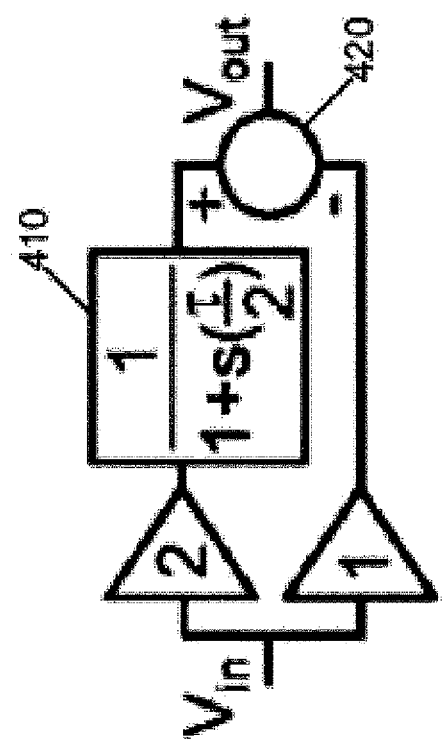
FIG. 4A illustrates a block view of an all-pass filter using active components.

Another technique is an all-pass filter using active components. FIG. 4A illustrates a block view of an all-pass filter using active components, and FIG. 4B illustrates an architectural view of the all-pass filter. See Garakoui, et al., "Compact Cascadable gm-C All-Pass True Time Delay Cell With Reduced Delay Variation Over Frequency", IEEE Journal of Solid-State Circuits, VOL. 50, NO. 3, MARCH 2015, 693-703. Previous implementations of all pass filters use cascades of gm-C (transconductance-capacitance) structure. FIG. 4A illustrates two amplifiers 1 and 2, an amplifier block 410, and an adder 420. The architectural view shows that the amplifiers are transconductor amplifiers having transconductances of $-g_m$, the amplifier block 410 comprises a capacitor C and resistor with a value of $1/g_m$ and another transconductor amplifier having a transconductances of $-2g_m$. These all-pass filters have the following issues:

1) They are inherently nonlinear.
2) The cascade of two active stages leads to more distortion.
3) The use of capacitance is prohibitive at mmW (millimeter wave) frequencies due to a low Q factor.
4) They need additional stages for providing impedance match.
5) No tuning mechanism is provided for adjusting phase shift.

Another possibility is using an active transconductor around a T-line (transmission line). See W. Lee and A. Valdes-Garcia, "Tunable Delay Line Using Distributed Inductive/Capacitive Miller Effect," 2018 IEEE/MTT-S International Microwave Symposium—IMS, Philadelphia, Pa., USA, 2018, pp. 1445-1448, doi: 10.1109/MWSYM.2018.8439492.

Now that an overview of the technical area in which the exemplary embodiments reside has been provided, exemplary embodiments are described. In contrast to what has been described, the exemplary embodiments involve a variable delay line using a cascaded all pass filtering approach.

Figure 5:
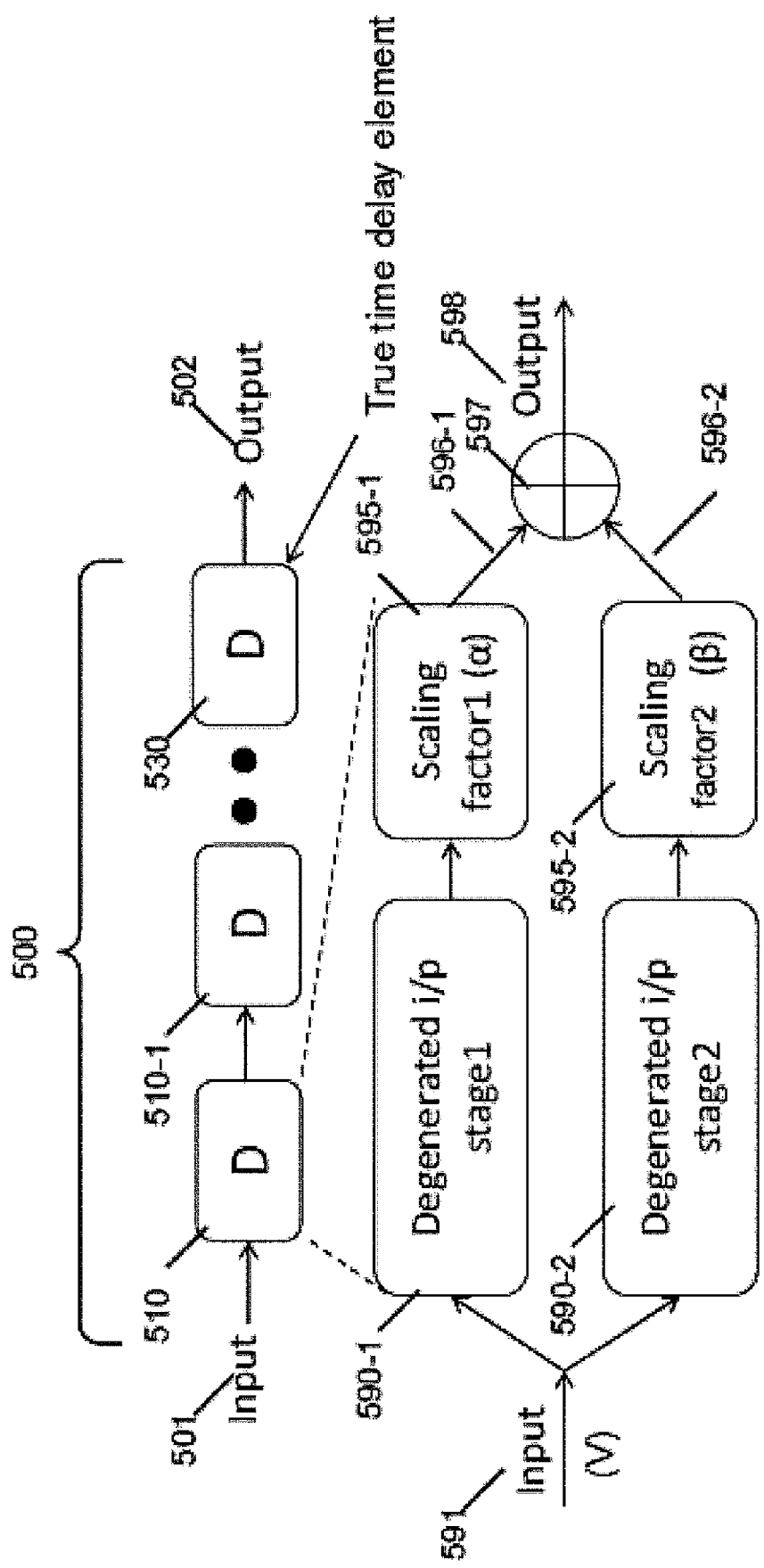
FIG. 5 illustrates an overview of exemplary variable delay line that uses a cascaded all-pass filtering approach, in accordance with an exemplary embodiment.
Figure 5A:
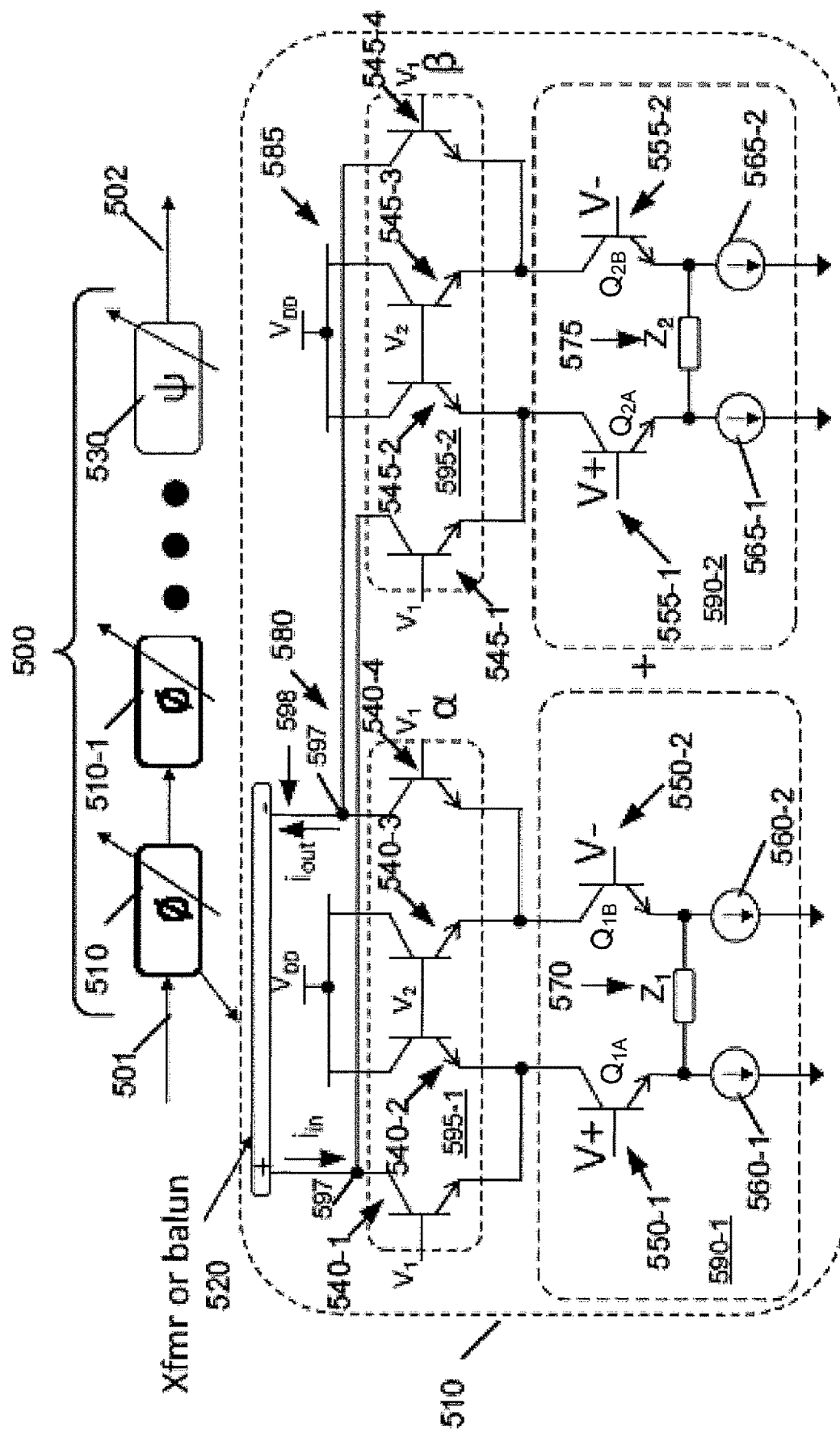
FIG. 5A illustrates the exemplary variable delay line of FIG. 5 with a more detailed example of a delay element, in an exemplary embodiment.

Turning to FIGS. 5 and 5A, FIG. 5 illustrates an overview of exemplary variable delay line that uses a cascaded all-pass filtering approach, in accordance with an exemplary embodiment, and FIG. 5A illustrates the exemplary variable delay line of FIG. 5 with a more detailed example of a delay element.

In FIGS. 5 and 5A, a delay line 500 includes multiple delay elements 510, 510-1, . . . , where each of these delay elements 500 is considered to be similar and one delay element 510 is illustrated as an overview in FIG. 5 and in additional detail in FIG. 5A. There is also a fine delay element 530, such as a T line or analog type, which is also referred to as a true time delay element in FIG. 5A. In these examples, the input 501 of the delay line 500 is connected to the delay element 510, and the output of the delay line 500 is the output of the delay element 530. The delay elements 510 may be referred to herein as "coarse" delay elements, as the delay effectuated by the delay elements 510 is typically larger than is the delay effectuated by the "fine" delay element 530. The order of the coarse 510 and fine 530 delay elements can be changed. Note also that multiple coarse delay elements 510 and a single fine delay element 530 are shown, but this may be changed (e.g., a single coarse delay element 510 might be used or multiple fine delay elements 530 might be used, or only coarse delay elements 510 could be used).

In FIG. 5, the delay elements are illustrated with D to indicate they are delay elements. Meanwhile, in FIG. 5A, the coarse delay elements 510 are assumed to have an adjustable (indicated by the arrow) phase of Ø, such as to either zero or 45 degrees, or perhaps zero, 22.5, and 45 degrees, or zero or 90 degrees, or the like; and the fine delay element 530 is assumed to have a finer phase of ψ, which may be in quite small increments, such as one percent phase from zero to 45 degrees of phase shift.

It is noted that the delay elements 510 (and 530) may also be considered to be phase shifters, and the phase is also modified by the delay elements. For clarity, however, this circuitry will be referred mainly as delay elements herein.

In the overview of FIG. 5, the coarse delay element 510 is shown as having an input 591 having a voltage of V, which is also input 501 for the first coarse delay element in the delay line 500, and having an output 598. The input 591 for the coarse delay element 510-1 would be the output 598 of the previous delay element 510. That is, inputs for a given delay element 510 comes from an output of a previous delay element 510 in the delay line 500.

The input 591 is split into two degenerated input (i/p) stages 590, stage1 590-1 and stage2 590-2, each of which is coupled to corresponding scaling factor stages 595, factor 1 (α) 595-1 and factor2 (β) 595-1. The scaling factors α and β are created and manipulated via stages 595 described in reference to FIG. 5A. The outputs 596-1, 596-2 of the scaling factors 595 are added by an adder 597, the output of which is the output 595 of the delay element 510.

With respect to FIG. 5 (and FIG. 5A), the following comments are made.

[1] The input 591 is provided to the two input stages 590-1, 590-1. The input 591 could be single-ended or differential.

[2] The input stages 1 590-1 and 2 590-2 provide different discrete phase shifts (various combinations are possible, such as the previously described zero and 45, or zero, 22.5, and 45 degrees).

[3] Scaling factors α and β are implemented in current mode (e.g., via current steering).

[4] Summing of the two paths 596-1, 596-2 lead to a zero and a pole; summing is performed in current mode.

[5] The pole and zero lead to formation of all-pass filter, and this achieves a delay.

[6] Output matching may be provided using wideband load (using passive L/C, inductance/capacitance, components).

[7] Bypass of this stage (a coarse delay element 510) is performed by setting β=0 (typical examples include stage1 590-1 using a resistive element and stage2 590-2 using a reactive element).

[8] Degeneration improves linearity and improves matching between the i/p transistors.

In FIG. 5A, the delay element 510 comprises a transformer (Xfrnr) or balun 520, and two circuits 580 and 585. Input 591 from FIG. 5A is illustrated as the V+ and V−, that is, one input 591 with a voltage V+ and its inverse V−. Circuit 580 includes circuitry for the degenerated input (i/p) stage1 590-1 and the scaling factor1 (α) stage 595-1. The scaling factor1 (α) stage 595-1 includes a set 540 of transistors corresponding to the scaling factor α, the set including transistors 540-1, 540-2, 540-3, and 540-4. The circuit 580 also includes the degenerated i/p stage1 590-1, including transistors 550-1 and 550-2, impedance 570, and current sources 560-1 and 560-2. Circuit 585 includes circuitry for the degenerated input (i/p) stage2 590-2 and the scaling factor2 (β) stage 595-2. The scaling factor1 (β) stage 595-2 includes a set 545 of transistors corresponding to a scaling factor β, the set including transistors 545-1, 545-2, 545-3, and 545-4. The degenerated i/p stage2 590-2 includes transistors 555-1 and 555-2, impedance 575, and current sources 565-1 and 565-2.

The degenerated i/p stages 590 may also be referred to as transconductors, as these convert input voltage to output current via the corresponding {Q1,Q2}, which are {$Q_{1A}$, $Q_{1B}$} for transistors 550-1 and 550-2, and {$Q_{2A}$, $Q_{2B}$} for transistors 555-1 and 555-2, The scaling factor stages 595 may be considered to be current steering devices. The structures within these are referred to as differential structures, and these provide structural symmetry. For instance, each of the following are differential structures: transistors 540-1, 540-2; transistors 540-3, 540-; transistors 545-1, 545-2; transistors 545-3, 545-4; transistors 550-1, 550-2; and transistors 555-1, 555-2.

The transistors illustrated in the figures are BJTs (bipolar junction transistors). The fundamental technique should work with either MOS (metal-oxide-semiconductor) transistors or BJTs. For BJTs, the terminals would be base, emitter and collector. For MOS, the corresponding terminals would be gate, source and drain. The base or gate terminals could be considered to be control terminals, and the base/emitter or source/drain can be input/output terminals.

The adder 597 in this case includes connections to the signal lines going to and from the transformer or balun 520. The output 598 is illustrated, as are the corresponding current $i_{in}$ and $i_{out}$.

The scaling factor α represents the fraction of (e.g., bias) current that is steered to the load and can be varied by $V_1$-$V_2$ in the scaling factor1 (α) stage 595-1. Similarly, the scaling factor β represents the fraction of current that is steered to the load and can be varied by $V_1$-$V_2$ in the scaling factor2 (β) stage 595-2. Once the circuitry for the coarse delay element has been fixed, the voltages for $V_1$-$V_2$ in the scaling factor1 (α) stage 595-1 and for the scaling factor2 (β) stage 595-2 are how the phases are selected.

The coarse delay for the coarse delay element 510 can be tuned in discrete steps by changing the real and imaginary amplifier transconductances $g_m$ with bias current and/or degeneration elements. Scaling of the transconductances in the real and/or imaginary parts lead to the change in delay. $Z_1$ and $Z_2$ are impedances, which control the delay, DC (direct current) gain, and input impedance matching; these functions can be made independent or inter-dependent. Degeneration may provide higher linearity, and input impedance match, relative to not using degeneration. For degeneration, this may include a further addition of resistors, capacitors, and/or inductors or other circuitry to adjust the delay (e.g., including phase) of the coarse delay element 510. These degeneration elements are not shown.

Degeneration is a technique that is well known and has been used extensively. The way to think about degeneration is the following: Any amplifier (can be voltage/current to voltage/current, all combinations depending on what type of amplifier is being addressed) has an input range over which the amplifier remains linear (i.e., the output is substantially linear versus the input). Based on the quiescent current, the output signal has a maximum value, so the same output signal would be obtained with a larger amplitude at the input with lower gain. The reduced gain is known as degeneration, and the amplifier operates linearly over a larger input swing than the one without degeneration Using $Z_2$ as an inductive element leads to an input impedance that remains substantially constant, and it is possible to realize an input match of 50Ω. One example consequently is that $Z_1$ is a resistor and $Z_2$ is an inductor, although other configurations are possible. When $Z_2$ is an inductor of value=L, this leads to a frequency domain impedance of Z=jωL.

For analysis, an example is chosen of using $Z_1$ as a resistor having a value of R, and $Z_2$ as an inductor, with a large Q factor and an inductance of L. Consider the following analysis for the input current:

$$i_{out} = \left\{\frac{\alpha g_{m1}}{1+g_{m1}R} + \frac{\beta g_{m2}}{1+g_{m2}sL}\right\}v_{in},$$

where vin is the input voltage V, and s is the Laplace operator, s=σ+iω, or $$i_{out} = \left(\frac{1}{1+g_{m1}R}\right)\left\{\frac{(\alpha g_{m1}+\beta g_{m2})+g_{m1}g_{m2}(\alpha sL+\beta R)}{(1+g_{m2}sL)}\right\}v_{in}.$$

Now consider that $Z_1$ and $Z_2$ have equal transconductances: $g_{m1}=g_{m2}=g_m$. This simplifies the equations as follows:

$$i_{out} = \left(\frac{g_m}{1+g_{m1}R}\right)\left\{\frac{(\alpha+\beta+\beta g_m R)+\alpha g_m sL}{(1+sLg_m)}\right\}v_{in},$$

for $g_m R \ll 1$, and $$i_{out} \sim g_m\left\{\frac{(\alpha+\beta)+\alpha g_m sL}{(1+sLg_m)}\right\}v_{in}.$$

The variable delay line 500 may be used for all-pass (AP), low-pass (LP), or high-pass (HP) filtering approaches. FIG. 6 is a table of scaling factors, output current, and phase shift for AP, LP, or HP filtering approaches in exemplary embodiments. The first two (AP) rows may be chosen as implemented cases, because of the constant gain over frequency, whereas the other options may lead to gain variation with frequency.

Another exemplary case is variant 1 (*one*) scaling, where $g_m R=1$. In this case, $$i_{out} \sim 0.5 g_m\left\{\frac{(\alpha+2\beta)+\alpha g_m sL}{(1+sLg_m)}\right\}v_{in}.$$

Depending on the product $g_m R$, the delay element may need adjustments for the scaling factors, using $g_m R=1$. FIG. 7 is a table of scaling factors, output current, and phase shift for AP, LP, or HP filtering approaches in exemplary embodiments for variant 1 (*one*) scaling. As with FIG. 6, the first two (AP) rows may be chosen as implemented cases, because of the constant gain over frequency, whereas the other options may lead to gain variation with frequency.

Another exemplary case is variant 2 scaling, where $g_m R=2$. In this case, $$i_{out} \sim 0.33 g_m \left\{ \frac{(\alpha + 3\beta) + \alpha g_m sL}{(1 + sL g_m)} \right\} v_{in}.$$

Depending on the product $g_m R$, the delay element may need adjustments for the scaling factors, using $g_m R=2$. FIG. 8 is a table of scaling factors, output current, and phase shift for AP, LP, or HP filtering approaches in exemplary embodiments for variant 2 (one) scaling. As with FIGS. 6 and 7, the first two (AP) rows may be chosen as implemented cases, because of the constant gain over frequency, whereas the other options may lead to gain variation with frequency.

As yet another example concerns generic scaling, where $g_m R=N$. In this case, $$i_{out} \sim \frac{1}{(1+N)} g_m \left\{ \frac{(\alpha + \beta(1+N)) + \alpha g_m sL}{(1 + sL g_m)} \right\} v_{in}.$$

The delay is as follows:

$$\text{Delay} = 2 \tan^{-1}\left( \frac{\alpha \omega L g_m}{\alpha + \beta(1+N)} \right) - \tan^{-1}(\omega L g_m).$$

Additionally, $$G_m = \frac{g_m}{(1+N)},$$

which is an "effective" transconductance that can be scaled by modifying N. That is, $$\frac{1}{(1+N)}$$

is a scaling factor. Also, the $$\left\{ \frac{(\alpha + \beta(1+N)) + \alpha g_m sL}{(1 + sL g_m)} \right\}$$

illustrates the phase.

Exemplary embodiments for implementation of delay lines have been described. Additional details about using the delay lines are now provided.

It can be beneficial to calibrate the delay line. As for calibration of wideband true time delay, exemplary theory concerning this includes the following:

1) The inductance value remains the same across P,T (process, temperature) corners.
2) The Q factor changes with P,T corners.
3) One example is to excite the delay line with respect to multiple frequencies, and measure delay using, e.g., a least mean square (LMS) algorithm.
4) Phase difference may be sensed by observing outputs from adjacent delay elements.
5) The accuracy of the passive delay element 530 may be used as a benchmark.
6) Coarse delay elements 510 may be calibrated one at a time.

One possible calibration procedure is as follows:
1) Change transconductance ($g_m$) by changing bias current.
2) Use two parts of a DAC, one of which is a fixed part providing constant $g_m$.
3) Use a second part of the DAC, which is a correction part of the DAC based on the LMS.
4) Provide multiple frequencies to the hybrid delay cell, one frequency at a time.
5) Perform a least mean square (LMS) mathematical fit to finalize the delay. What is intended by using the LMS algorithm is that the scaling factors (e.g., coefficients) $\alpha$ and $\beta$ are determined so that the phase shifter is optimized to operate over a wide frequency range so that the delay is realized accurately.

Figure 9:
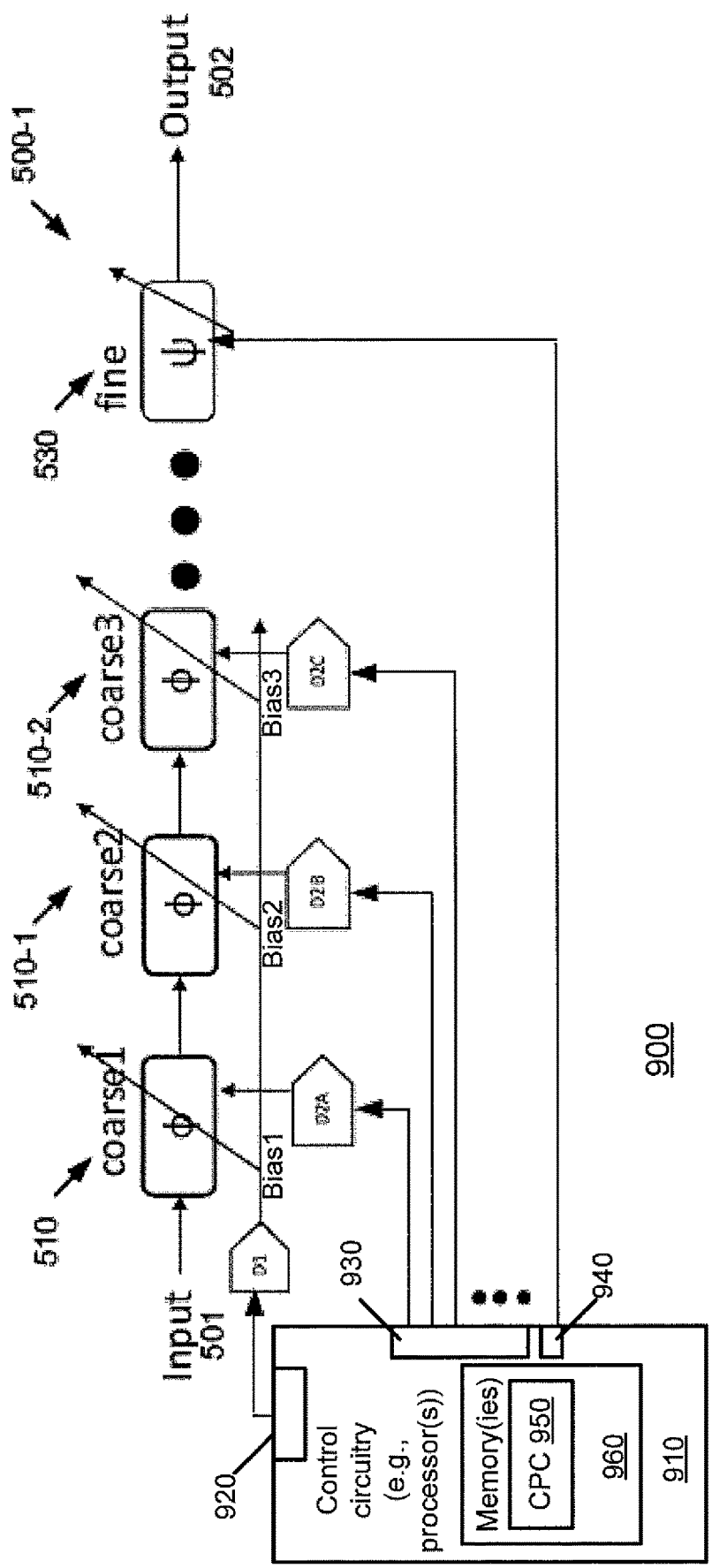
FIG. 9 illustrates an exemplary delay line and associated circuitry configured for calibration of wideband true time delay, in accordance with an exemplary embodiment.

Referring to FIG. 9, this figure illustrates an exemplary delay line 500-1 and associated circuitry configured for calibration of wideband true time delay, implemented in a device 900 (such as a receiver or transmitter) in accordance with an exemplary embodiment. Control circuitry 910 is illustrated, and comprises DACs (digital to analog converters) 920, 930, and 940, and one or more memories 950 (comprising CPC, computer program code, 960) in this example. The control circuitry 910 may comprise one or more special- or general-purpose processors, or application specific system processors or other processors such as microcontrollers or DSPs (digital signal processors). Alternatively or additionally, the control circuitry 910 may comprise other hardware such as programmable logic devices, application-specific integrated circuits (ASICs), very large scale integration (VLSI) circuits, or the like. The control circuitry 910 may be programmable, e.g., via the computer program code 950 in the one or more memories 960. The one or more memories 960 may include read only memory, random access memory, solid state memory, or any other memory. The CPC 950 and/or the control circuitry 910 may have program(s) and data storage, such as being programmed to implement the processes described herein and to store the data acquired or used herein. Assuming the CPC 950 is used, the one or more memories 960 and the computer program code 950 may be configured to, with the control circuitry 910 cause the device 900 to perform one or more of the operations as described herein.

This example has the control circuitry 910 comprising three DACs 920, 930, and 940. This is for case of reference and clarity, and these DACs can be combined into a single DAC or other corresponding circuitry or further subdivided. DAC 920 is a fixed part of the DAC, which provides constant $g_m$. DAC 930 is a correction part, which applied a correction that is added to the constant $g_m$. The correction part 930 may use codes that are stored, where each code corresponds to a particular output for D2x (see below). The DAC 940 is specifically for the fine delay element 530 and also produces an output to adjust the phase of the fine delay element 530.

The DAC 920 outputs D1, which is a constant $g_m$ bias, and DAC 930 outputs D2x, where "x" is A, B, C, . . . , and is a correction DAC signal for x-th delay element coefficients (and the correction DAC 930 is adjusted from calibration). The bias (as Bias1, Bias2, Bias3, . . . corresponding to each respective coarse delay element 500, 500-1, 500-2, . . . ) is a sum of D1 and D2x, and adjusts voltages for $V_1$-$V_2$ in the scaling factor1 ($\alpha$) stage 595-1 and for the scaling factor2

(β) stage 595-2. Thus, a single bias for one delay element 510 could include the constant $g_m$ bias, and up to four other signals, two for $V_1$, $V_2$ in the scaling factor1 (α) stage 595-1, and another two for $V_1$, $V_2$ in the scaling factor2 (β) stage 595-2. It is also possible to have fewer signals the scaling factor stages 595-1 and 595-2, such as One exemplary procedure for Process, Voltage and Temperature (P, V, T) calibration is as follows. This is an overview of one possible process, and FIG. 11 contains another example of such a process.

1) Choose a frequency of operation (F1).
2) Take two adjacent delay elements for phase shifter chain 1 (PS1), and phase shifter chain 2 (PS2).
3) Keep specific settings for coarse1 510 and coarse2 510-1 delay elements (at any of the two settings, min or max, where min=a minimum phase and max=a maximum phase).
4) Set coarse3 510-2 to lowest targeted phase shift (e.g., 0°, zero degrees) and the fine delay 530 for a known specific phase shift (e.g., 45°): PS1.
5) Set coarse3 for a 450 phase shift and 0° for the fine phase shift: PS2.
6) Make a phase error difference between PS1 and PS2 by one of the methods: (a) subtraction of signals; (b) multiply to make a vector product become zero (e.g., a mixer-based approach); or (c) perform null detection in the beam pattern.
7) Perform the above steps at multiple frequencies F2, F3, . . . .
8) Use the LMS algorithm to minimize error by setting D2C.
9) Repeat the above steps for coarse1 and coarse2 delay elements individually.
10) Obtain settings for D2A and D2B.
11) A digital algorithm can compensate for residual error after calibration if needed for further precision.

Figure 10A:
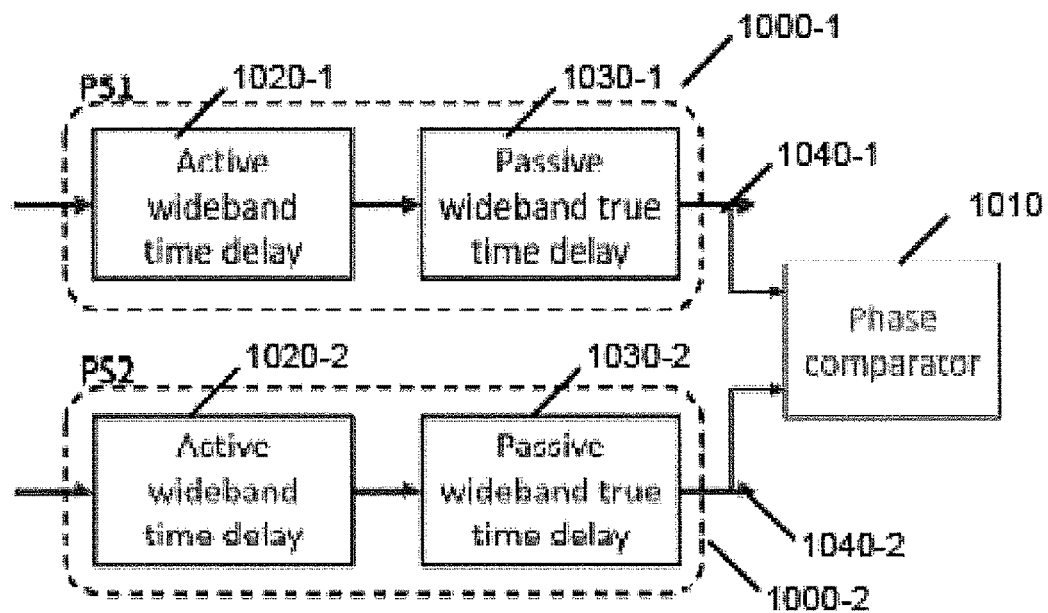
FIG. 10A illustrates a phase comparison for adjacent channels for hybrid delay calibration, in accordance with an exemplary embodiment.

One example for determining a phase error difference (see (6) above) is to use a phase comparator. FIG. 10A illustrates a phase comparison for adjacent channels for hybrid delay calibration, in accordance with an exemplary embodiment. Two phase shifter chains PS1 1000-1 and PS2 1000-2 are illustrated, and shown coupled via corresponding outputs 1040-1 and 1040-2 to a phase comparator 1010. Each of the phase shifter chains PS1 1000-1 and PS2 1000-2 is a version of a delay line 500 as previously described. The phase shifter chain PS1 1000-1 includes an active wideband time delay portion 1020-1, including a number of coarse delay elements 510, and a passive wideband true time delay portion 1030-1, including a fine delay element 530. The phase shift channel PS2 1000-2 includes an active wideband time delay portion 1020-2, including a number of coarse delay elements 510, and a passive wideband true time delay portion 1030-3, including a fine delay element 530.

The phase comparator 1010 can be implemented in multiple ways. For instance, this could be performed using a baseband implementation, such as using a phase detector or measuring a null of the beamformer. Alternatively, this could be performed using RF implementation, such as using a mixer as a phase detector or using a subtractor approach.

Figure 10B:
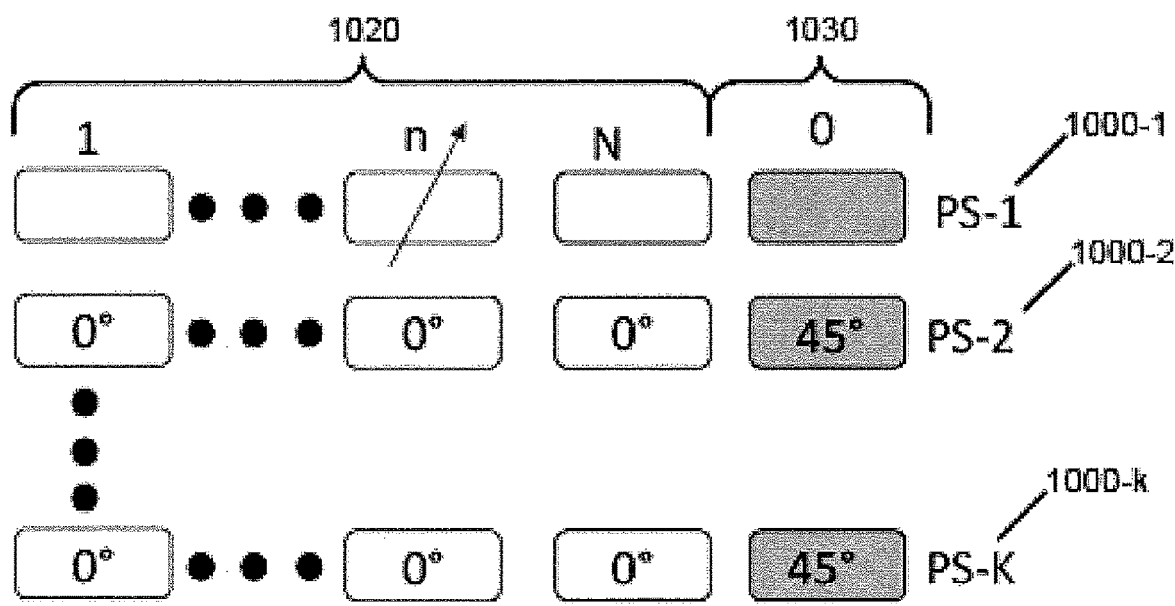
FIG. 10B illustrates a phase comparison for adjacent channels for hybrid delay calibration, performed in the contest of a beamforming array, in accordance with an exemplary embodiment.

Turning to FIG. 10B, this figure illustrates a phase comparison for adjacent channels for hybrid delay calibration, performed in the contest of a beamforming array, in accordance with an exemplary embodiment. There are multiple (K) phase shifter channels 1000-1, 1000-2, . . . , 1000-k, used for a beamforming array. Each phase shifter channel 1000 includes multiple (N) active stages 1020 and one passive stage 1030. This figure illustrates how phase shifter channel 1000-1 might be tested, as the phase shifter channels 1000-2, . . . , 1000-k have their N active stages 1020 set to zero degrees and have their passive stages 1030 set to 45 degrees. Meanwhile, the "n" and corresponding arrow for the n-th coarse delay element in the phase shifter channel 1000-1 indicates the delay element that is set to various coarse values, such as 45 degrees.

In terms of calibration of wideband true time delay, the following observations are made:
1) BEOL (back end of line) based inductance and capacitance remain the same across PVT corners.
2) Q factor changes with PVT corners but does not affect phase.
3) Delay calibration of the active phase shifter needs to be performed across a wide frequency range.

The inventors have determined that using the accuracy of the passive tunable delay as the benchmark to calibrate active components is one way to calibrate the delay lines.

Figure 11:
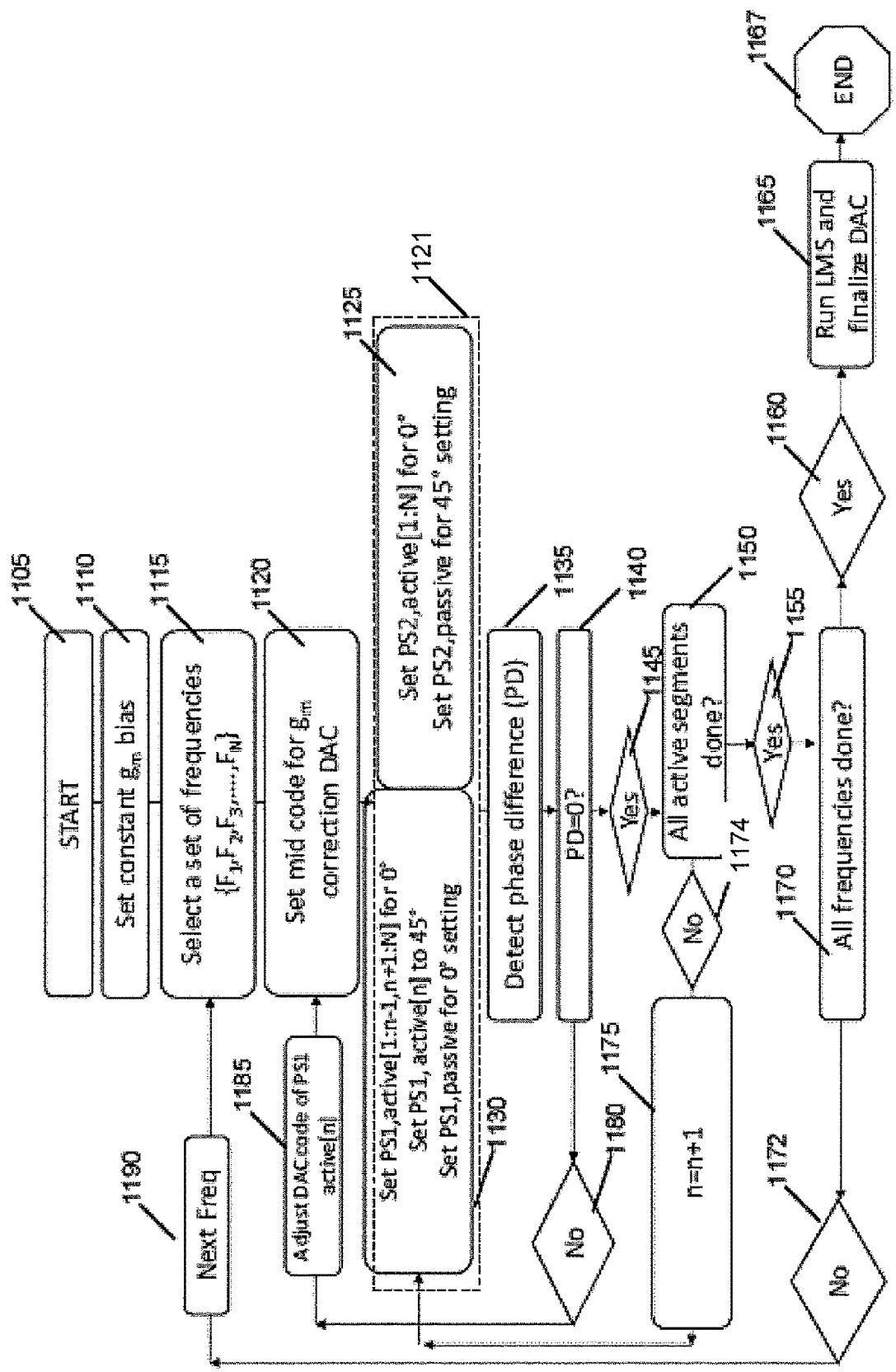
FIG. 11 is a flowchart for calibration of two delay lines, also referred to as phase shifter chains, in accordance with an exemplary embodiment.

FIG. 11 is a flowchart for calibration of two delay lines, also referred to as phase shifter chains, in accordance with an exemplary embodiment. FIG. 11 describes in more detail what has already been briefly described above. FIG. 11 also illustrates the operation of an exemplary method or methods, a result of execution of computer program instructions embodied on a computer readable memory, functions performed by logic implemented in hardware, and/or interconnected means for performing functions in accordance with exemplary embodiments. The operations in FIG. 11 are assumed to be controlled by the control circuitry 910. Note that the control circuitry 910 may be following a program (e.g., in the computer program code 950) supplied by a user for some or all of this flow. The DACs 920 and 930 are controlled by the control circuitry 910.

The flow in FIG. 11 starts in block 1105, and in block 1110, the control circuitry 910 configures the DAC 920 to set a constant $g_m$ bias. The control circuitry 910 selects a set of N frequencies in block 1115: $\{F_1, F_2, F_3, \ldots, F_N\}$. In block 1120, the control circuitry 910 sets a mid code for the DAC correction for the DAC 930. The mid code is a code in the middle of a range of codes over which the correction may be varied, where the codes corresponding to correction for the scaling factor stages 595, factor 1 (α) 595-1 and factor2 (β) 595-1. For instance, one example has the correction terms being given by $V_1-V_2$, or ΔV. Typically, one way this might be implemented is $V_1=V_0+\Delta V$ and $V_2=V_0-\Delta V$, where $V_0$ is a bias voltage that supports a quiescent operation. The block 1120 (and see also block 1130) may therefore involve setting one or more of the ΔV for the scaling factor stages 595, factor 1 (α) 595-1 and factor2 (β) 595-1. These could be independently set or the two could be related to a single voltage difference. There is a total bias that is applied, which is an addition of the constant $g_m$ bias and a bias corresponding to a bias (or biases) corresponding to the mid code.

The flow proceeds to block 1121, where blocks 1130 and 1125 are performed. In block 1130, for the phase shifter chain PS1 (a delay line 500), the coarse delay elements 510, which are indicated as being active elements ("active"), are set for [1: n−1, n+1: N] for zero degrees (0°). In other words, there are N delay elements 510, and all but the n-th one are set for zero degrees. For PS1, the active[n] is set to 45°. The fine delay element 530, indicated as being a passive element ("passive"), is set for a zero degrees (0°) setting. In block 1125, for the phase shifter chain PS2 (another delay line 500), the coarse delay elements 510, which are indicated as being an active element ("active"), are all set [1:N] for zero degrees (0°). In other words, there are N delay elements 510, and all are set for zero degrees. For PS2, the fine delay element 530, indicated as being a passive element ("passive"), is set for a 45 degrees (45°) setting.

In block 1135, a phase difference (PD) is detected. Block 1140 determines whether the PD is zero. If the PD is non-zero, block 1180=No and the flow proceeds to block 1185, where the DAC code of PS1 for the n-th active[n] delay element 510 is adjusted and flow proceeds back to block 1120. Note this could be an increase or decrease in the code, and the next time block 1185 is performed, a decision could be made as to whether to proceed in the current direction (increase or decrease) or to change direction. For example, if an increase was previously made and this caused a higher PD, then a decrease could be made in block 1185.

If the PD is zero (e.g., or within some variance of zero), block 1145 is Yes and the flow proceeds to block 1150, where it is determined whether all active segments (i.e., coarse delay elements 510) are done. If not, block 1174 is No and the flow proceeds to block 1175, where n=n+1, and the flow proceeds back to block 1130. If all active segments are done, then block 1155 is Yes, in block 1170, it is determined of all frequencies have been done. If not, block 1172=No, the next frequency is chosen in 1190, in conjunction with the set of frequencies in block 1115. Note that for the LMS analysis in block 1165, the DAC correction codes are stored per frequency, for use by the LMS algorithm.

If all frequencies have been done, block 1160=Yes, and an LMS algorithm is run and the DAC is finalized (block 1165), meaning the $g_m$ bias for the DAC 920 and code(s) for the correction DAC 930 for each of the coarse delay elements are known and stored. The flow ends in block 1167.

FIG. 11 includes two delay elements, but this can be extended to a full phased array with more than two delay elements. The differential calibration is repeated for adjacent elements to cover all the elements in a phased array.

Additionally, FIG. 11 is an example of zero and 45 degrees for the active delay elements, but if the active delay element has more phases (e.g., 90 degrees also) or different phases (e.g., 0, 22.5, and 45 degrees), the same process may be performed, e.g., as long as the passive delay element supports these phases.

Figure 12:
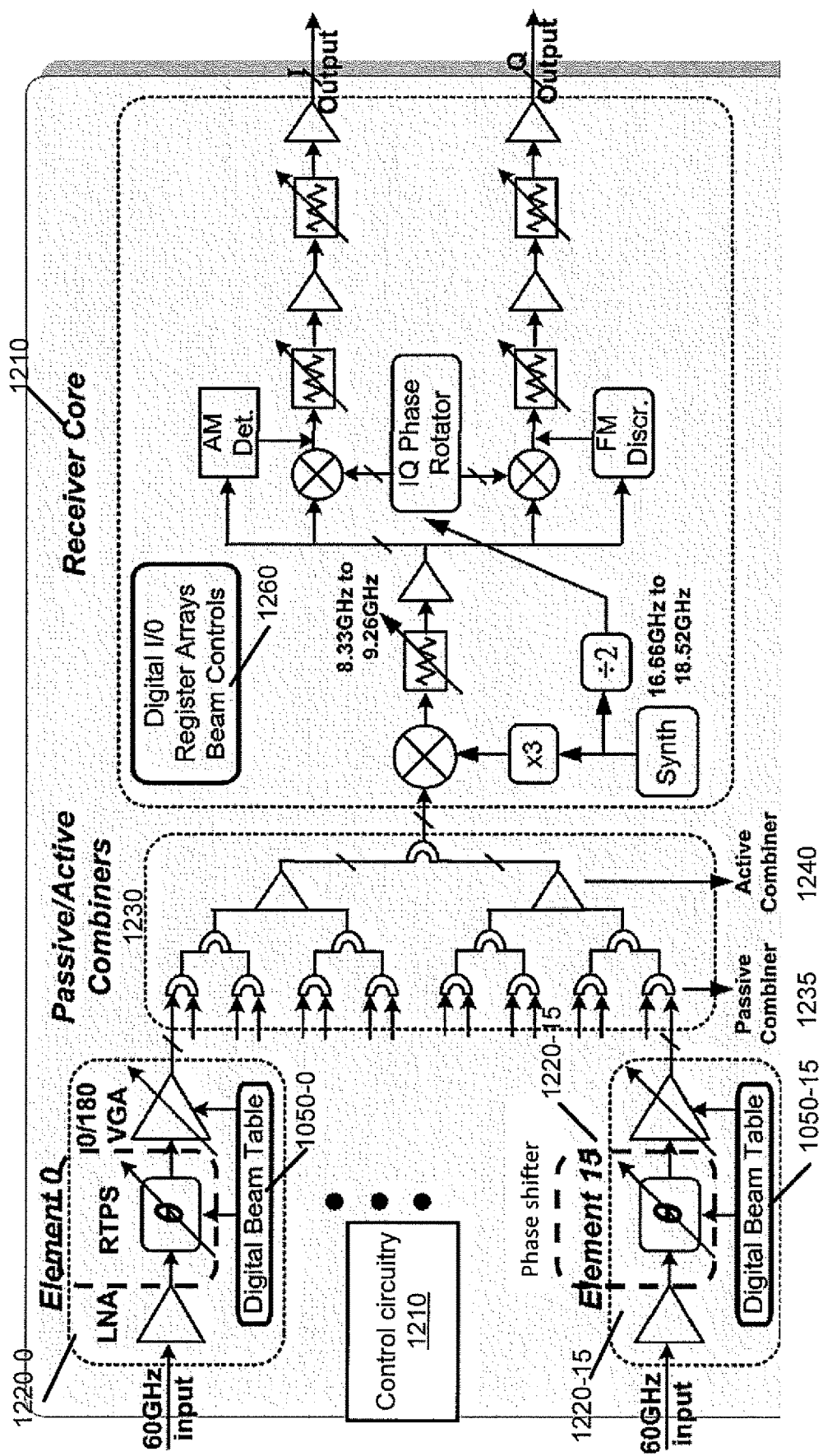
FIG. 12 is an illustration of use of an exemplary tunable delay line for a phase array application, in accordance with an exemplary embodiment.

FIG. 12 is an illustration of use of an exemplary tunable delay line for a phase array application, in accordance with an exemplary embodiment. The device 900-1 is a receiver and comprises 16 elements 1220-0 through 1220-15, each of which accepts a 60 GHz input and has an LNA (low noise amplifier) followed by a corresponding delay line 500-0 through 500-15 and by a VGA (variable gain amplifier). A digital beam table 1050-0 through 1050-15 feeds corresponding delay lines 500-0 through 500-15 and VGAs. These are input into a passive/active combiner block 1230, which contains 16 passive combiners 1235 in a first stage, then four passive combiners 1240 in a second stage, then two active combiners and finally a single passive combiner that outputs to a receiver core 1210.

The receiver core 1210 comprises digital I/O (input/output) register arrays and beam controls 1260 used to control at least the receiver core 1210. There is a multiplier that accepts an ×3 (times three) from a synthesizer, which also outputs to a divider (÷2) that outputs 16.66 Ghz to 18.52 GHz, which outputs to an IQ phase rotator. The multiplier outputs to a frequency adjuster, providing frequency adjustment from 8.33 Ghz to 9.26 GHz, then to an amplifier. The output of the amplifier goes to an AM detector, another multiplier, a frequency adjuster, an amplifier, another frequency adjuster, and another amplifier, to create an I output. The output of the amplifier also goes to an FM discriminator, another multiplier, a frequency adjuster, an amplifier, another frequency adjuster, and another amplifier, to create a Q output.

The device 900-1 may also comprise control circuitry 1210, which controls the operation of the device. This would include the control circuitry 910, and control each of the 16 elements 1220-0 through 1220-15, along with other elements in the device.

Figure 13:
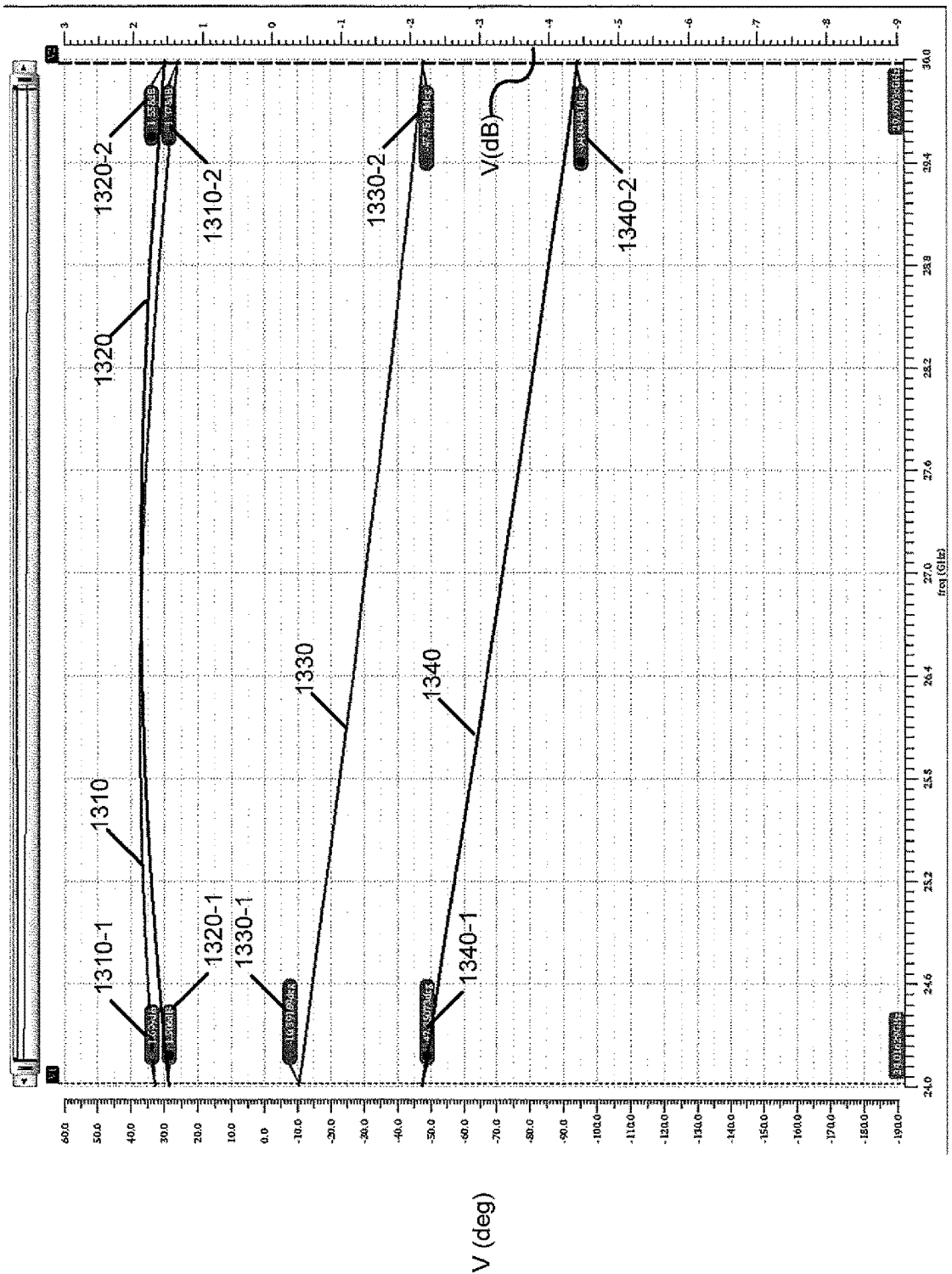
FIG. 13 illustrates simulation results for a single active delay element 510 with inductive loading.

Turning to FIG. 13, this figure illustrates simulation results for a single active delay element 510 with inductive loading. There are four curves illustrated: curves 1310 and 1320 are for amplitude in decibels (dB), see the right vertical axis of V(db); and curves 1330 and 1340 correspond respectively to 1310 and 1320, and illustrate phase in degrees, see left vertical axis of V(deg). The horizontal axis is in frequency (GHz) from 24.0 to 30.0 GHz. Point 1310-1 is 1.694 dB, and point 1310-2 is 1.378 dB. Point 1320-1 is 1.506 dB, and point 1320-2 is 1.558 dB. Point 1330-1 is −10.39189 degrees and point 1330-2 is −47.75134 degrees. Point 1340-1 is −47.35073 degrees and point 1330-2 is −94.09481 degrees.

As can be seen, the amplitude difference over the band <200 mdB, and there is a linear phase, ~10 degrees variation over band. If one uses two active delay elements 510, each can provide a 45-degree shift for this example. For the 10 degrees of delay variation over frequency, the plot shows that at 24 GHz frequency, the difference between two curves is −37 degrees (47−10) while it is ~47 degrees (94−47) at 30 GHz. "V" is the normalized amplitude of the output, where the input is normalized to unity. It can also be used as "gain" of the circuit, and it takes into consideration the phase shift as well as the frequency dependence of the load network. Thus, one may obtain {0,45,90} degrees from two delay elements. An addition of a passive fine delay line for a 45-degree interpolation. This may reduce passive phase shifter size by four times per channel.

FIG. 13 may also be used to illustrate the following. One aspect of the exemplary embodiments is to enable a specific phase versus frequency characteristic in the active, coarse variable delay elements 510. One idea is to create a phase-frequency slope that makes the active delay elements behave like true time delays over a wide frequency range, similar to the passive delay elements that have been described. The active delay takes a lot less area, providing an overall benefit.

Regarding the phase versus frequency slope in more detail, a true time delay has a particular phase versus frequency slope, as shown in FIG. 1B. A physical delay corresponds to a true time delay, where at a low frequency, there is a delay corresponding to a given phase shift ($\theta_1=2\pi f_{low}$/delay), but at a higher frequency, the delay remains the same but the phase shift increases ($\theta_2=2\pi f_{high}$/delay>$\theta_1$, for $f_{low}$>$f_{high}$). Typically, active phase shifters do not have this property. Instead, they typically provide a characteristic similar to that shown in FIG. 1A. As shown by comparative examples in FIGS. 3A and 3B, and FIGS. 4A and 4B, having the phase profile in FIG. 1B is preferable to having the phase profile in FIG. 1A. To this end, the exemplary circuits herein are able to have this FIG. 1B-like property despite being an active circuit, as illustrated by FIG. 13. That is, FIG. 13 illustrates a FIG. 1B-like characteristic variation in phase with frequency.

Figure 14A:
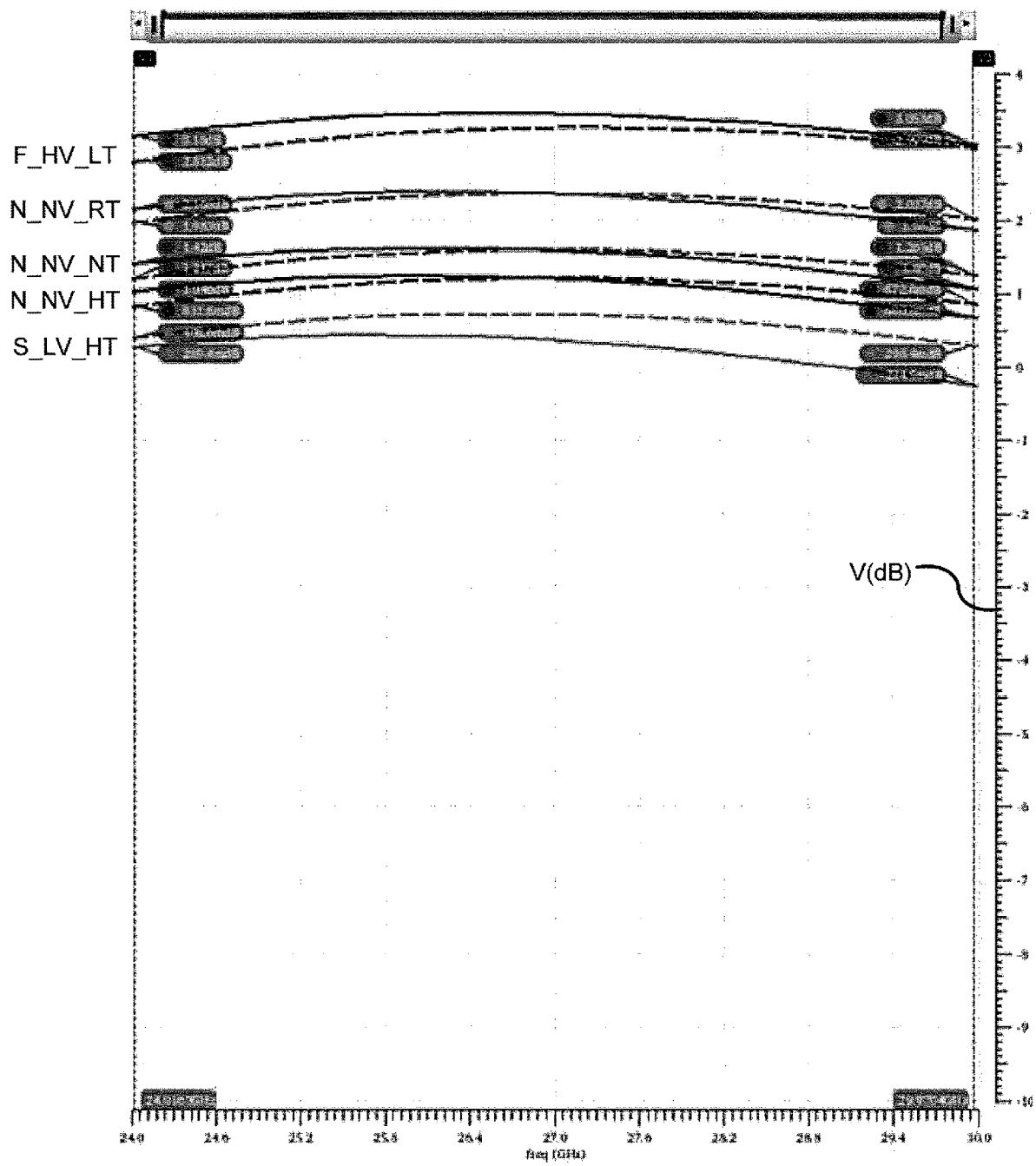
FIGS. 14A and 14B illustrate simulation results over standard process (P) and temperature (T) corners, where
Figure 14B:
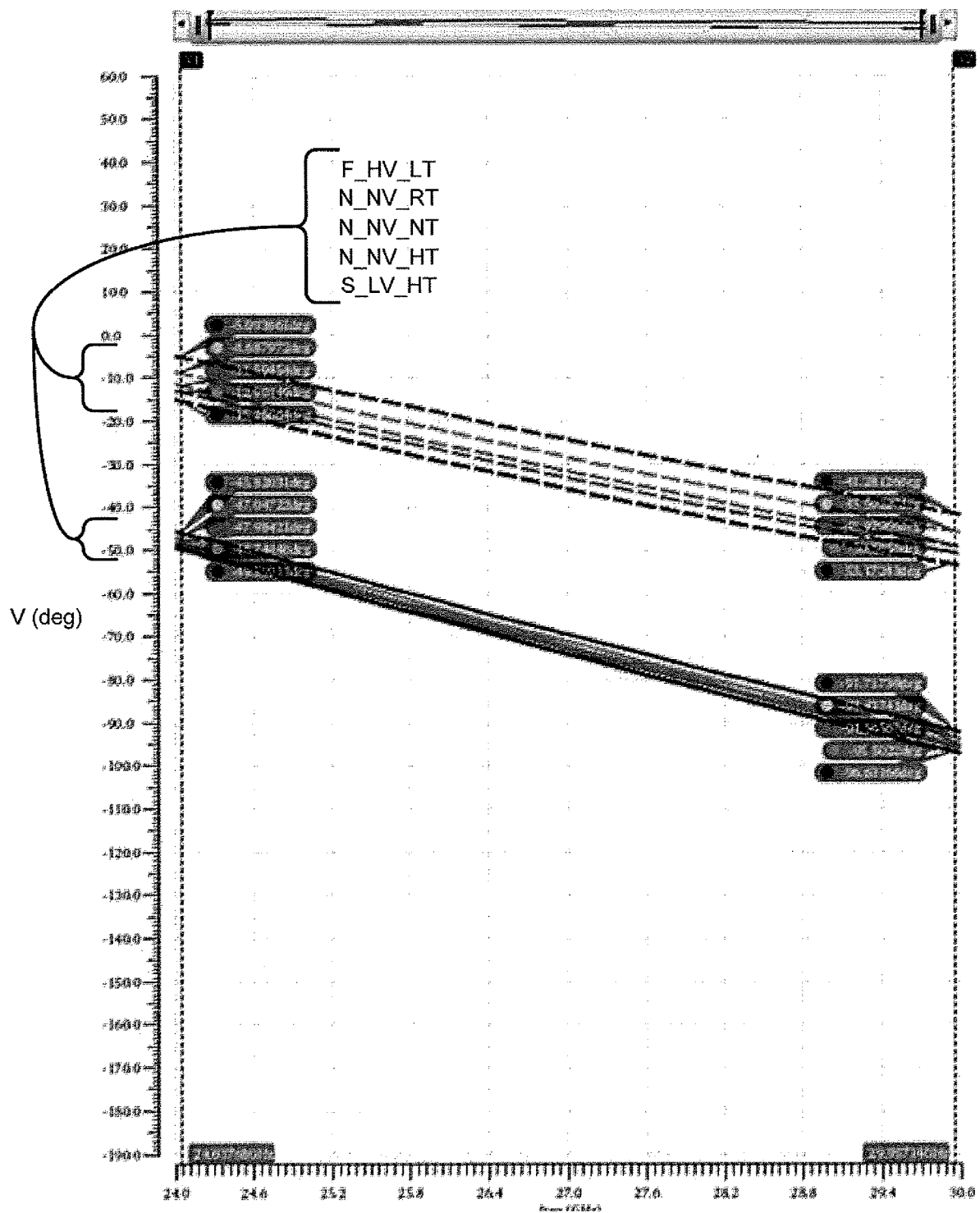
Figure 15A:
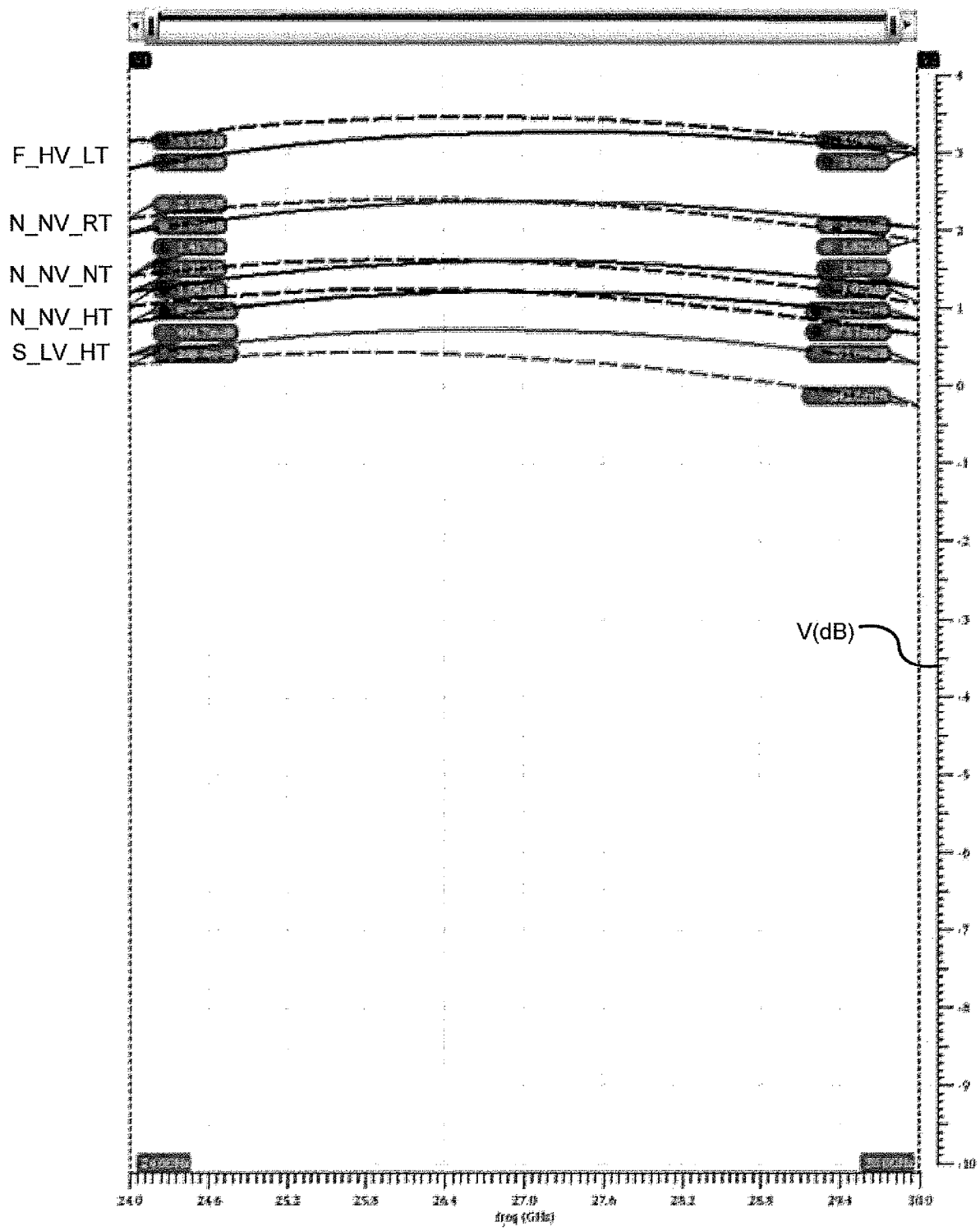
FIGS. 15A and 15B illustrate simulation results for group delay variation over standard P,T corners, where
Figure 15B:
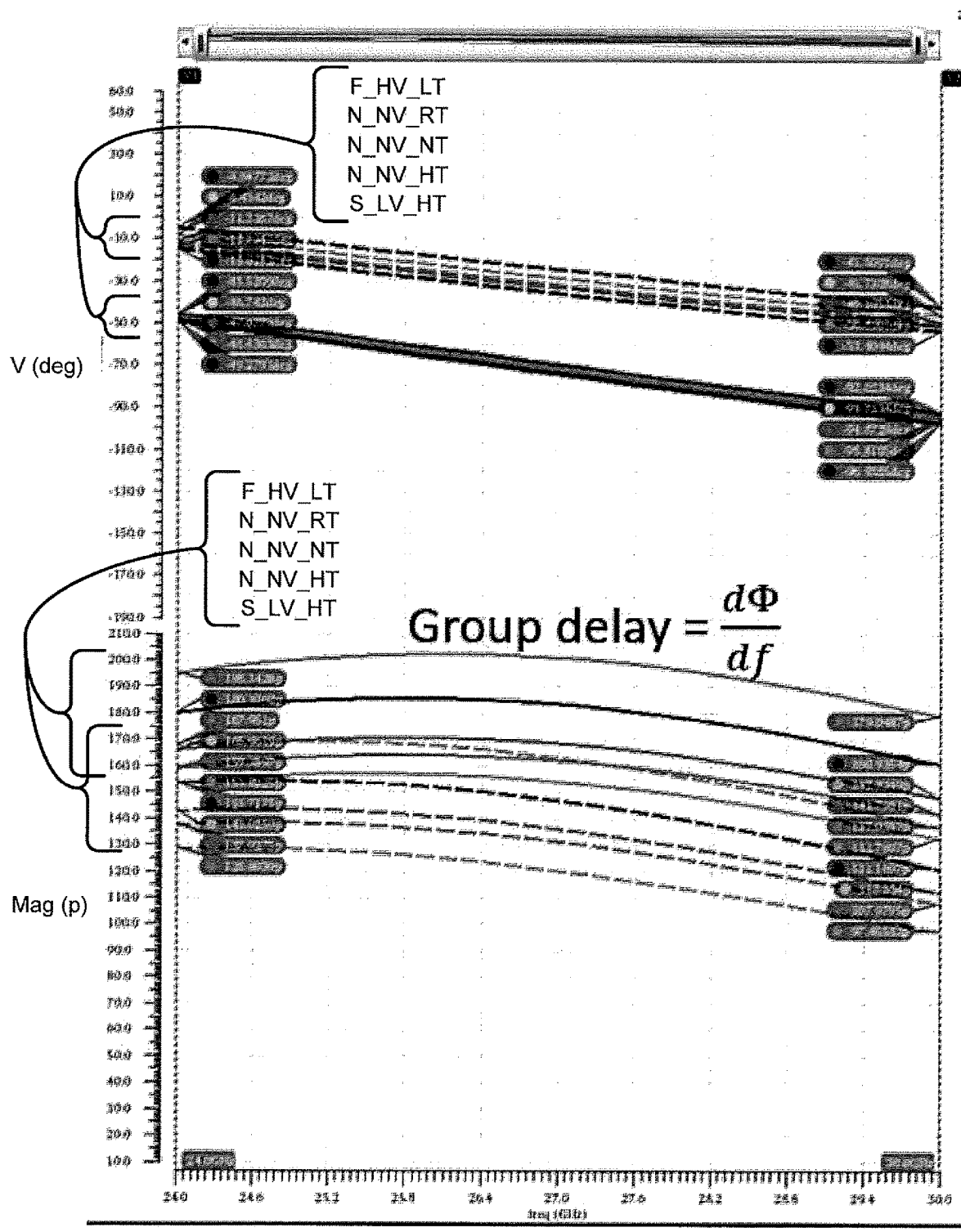

The device 900 and the like may be tested for Process, Voltage and Temperature (P, V, T, or PVT) variation and corresponding corners. FIGS. 14A and 14B illustrate simulation results over standard process (P) and temperature (T) corners, where FIG. 14A illustrates amplitude and FIG. 14B illustrates phase. FIGS. 15A and 15B illustrate simulation results for group delay variation over standard P,T corners, where FIG. 15A illustrates amplitude and FIG. 15B illustrates phase and group delay.

There are a number of options for measuring corners for this, including the following, described in nomenclature that may be used. The nomenclature S_HV_LT means this is a "Slow" process corner (the first alphabet, S) with High Voltage (the second item, HV) and Low temperature (third item, LT). The nomenclature S/F/N means Slow/Fast/Nominal. The nomenclature HV/NV/LV means High voltage, Nominal voltage, Low voltage. The nomenclature HT/NT/LT means High Temp, Nominal temp, low temp. Basically, these are used to observe robustness of design with respect to process, voltage and temperature variations of the transistors. The temperature is the junction temperature and not ambient temperature. In FIGS. 14A, 14B, 15A, 15B, the following nomenclature is shown and interpreted via the previous nomenclature: F_HV_LT; N_NV_RT; N_NV_NT; N_NV_HT; and S_LV_HT.

For FIGS. 14A and 14B, multi-section staggered segments (e.g., delay elements 510) can be used in cascade to achieve substantially constant phase difference across two phase settings. The bias currents can be P,T-tracking-type as well, to compensate for variations.

For FIGS. 15A and 15B, these provide a phase derivative of the phase versus the frequency plot shown before. This is for a single stage only, and it is possible to reduce variation by a cascaded approach. In these figures, Mag (p) is magnitude of $$p = \frac{d\Phi}{dt},$$

e.g., the group delay shown. The variable p was a simulation variable.

The exemplary embodiments may be considered to implement a hybrid delay approach, e.g., between a vector modulation-based implementation and a true time-delay implementation using microwave techniques. This is in contrast to conventional techniques.

One conventional technique is vector modulation-based implementation, which may be considered to have a relatively narrow bandwidth, the resolution may be DAC (digital-analog converter) based or otherwise with digital control, the input matching works for 50Ω input impedance. The area may be relatively compact, and the input is quadrature phase. The structure/construction is active, and it provides gain. For a true time-delay implementation using microwave techniques, which is another conventional technique, the bandwidth may be relatively wide, and the resolution may be DAC (digital-analog converter) based or otherwise with digital control. The input matching for this has low impedance preferred to reduce loss, and the area is relatively large (e.g., due to transmission lines). The input can be single-phase or differential phase, and the structure/construction is generally passive, providing loss.

By contrast, the hybrid delay approach herein combines beneficial elements of both of these. For instance, the exemplary embodiments may be applicable to wide bandwidth, and wide bandwidth or true time delay is beneficial for a phased array application. The resolution may be DAC (digital-analog converter) based, and provide digital control. Digital control is preferred for easy reconfiguration/calibration. The exemplary embodiments may provide input matching, such as 50M input impedance. 50M input impedance is preferred in some applications for seamless interface and placement in the architecture. The area may be compact for the exemplary embodiments, as for a given area, the use of transistors and the like provide more density, as compared, e.g., to transmission line usage. Having a compact area is preferred for some implementations to reduce loss and increase number of array elements. The input for the exemplary embodiments may be single or differential phase, and single ended/differential is preferred in certain applications for signal distribution, and can be converted between each other using baluns, for instance. The structure of the exemplary embodiment may be hybrid, such as providing gain, as signal gain may be needed in some implementations to keep low power.

Without in any way limiting the scope, interpretation, or application of the claims appearing below, technical effects and advantages of one or more of the example embodiments disclosed herein include one or more of the following:

1) Proposed delay lines can reduce area for a wideband phased array system.

2) The proposed delay lines can provide power gain (unlike passive delay lines).

3) Exemplary proposed delay lines may provide input impedance match to 50Ω.

4) The exemplary embodiments can be used as single ended or differential. For instance, the exemplary embodiments can be configured for single-ended and differential signal paths.

5) The exemplary embodiments can be used to provide continuous delay (by using $Z_2$ as a tunable transmission line or changing α and β in small steps).

6) The exemplary embodiments can be made to track P,T variation by making $g_m \sim 1/R$.

7) The order of delay cells (coarse, fine) can be changed to provide more functionality.

8) The exemplary embodiments can be used in lieu of a distortion canceller, an image reject mixer, or a clock delay.

9) The techniques herein can be used to realize RF (radio frequency) beamforming, LO (local oscillator) beamforming, or IF (intermediate frequency) beamforming, leading to wide flexibility. In more detail, in a Cartesian approach of multiplying two waveforms IF and LO, we get two terms LO+IF and LO−IF. Beamforming actually means providing different phase shifts to different elements in an array, and that can be done in either LO and IF, and as RF is a linear sum and difference of the LO and IF terms, the phase shift in either one of them leads to the same phase shift in RF domain.

If desired, the different functions discussed herein may be performed in a different order and/or concurrently with each other. Furthermore, if desired, one or more of the above-described functions may be optional or may be combined.

Although various aspects of the invention are set out in the independent claims, other aspects of the invention comprise other combinations of features from the described embodiments and/or the dependent claims with the features of the independent claims, and not solely the combinations explicitly set out in the claims.

It is also noted herein that while the above describes example embodiments of the invention, these descriptions should not be viewed in a limiting sense. Rather, there are several variations and modifications which may be made without departing from the scope of the present invention as defined in the appended claims.

What is claimed is:

1. An apparatus comprising:
a phased array system comprising:
a set of tunable delay elements comprising at least one active delay element and at least one passive delay element, wherein the at least one active delay element provides a first resolution, and the at least one passive delay element provides a second resolution, wherein the second resolution is smaller than the first resolution, and the resolution corresponds to delay applied to an input signal by a corresponding one of the active or passive delay elements, and
wherein the first resolution is a first set of discrete steps for phase over which the at least one active delay element can be operated, the second resolution is a second set of discrete steps for phase over which the at least one passive delay element can be operated, and a number of discrete steps in the first set is less than a number of discrete steps in the second set.

2. The apparatus of claim 1, wherein for the at least one active delay element, the delay is programmed by adjusting current within the at least one active delay element.

3. The apparatus of claim 1, wherein the at least one active delay element provides at least two different delays as the set of discrete steps.

4. The apparatus of claim 1, wherein the at least one active delay element comprises a plurality of delay elements, the active delay elements comprising:
first circuitry comprising a first input stage and first scaling factor stage, the first input stage outputting to the first scaling factor stage;
second circuitry comprising a second input stage and a second scaling factor stage, the second input stage outputting to the second scaling factor stage;
an adder adding outputs from the first and second scaling factor stages and producing an output for the active delay element.

5. The apparatus of claim 4, wherein:
the first input stage comprises an impedance $Z_1$;
the second input stage comprises an impedance $Z_2$;
$Z_1$ and $Z_2$ are impedances that control one or more of a delay, a direct current gain, or input impedance for the active delay element.

6. The apparatus of claim 5, wherein the first and second scaling factor stages are configured to perform current steering toward a respective one of the impedance $Z_1$ or the impedance $Z_2$ via adjustment of respective first voltages for the first and second scaling factor stages, and wherein the active delay element is configured based on the impedances $Z_1$ and $Z_2$ and operation of the current steering to enable a phase versus frequency characteristic in the active delay element in response to a second voltage being applied to the first and second input stages, the second voltage corresponding to a signal to be delayed.

7. The apparatus of claim 5, wherein impedance $Z_1$ is a resistor and impedance $Z_2$ is an inductor.

8. The apparatus of claim 5, wherein:
the first input stage comprises two transistors in a differential configuration, a first transistor having a control input coupled to an input voltage, a first input/output terminal coupled to the first scaling factor stage, and a second input/output terminal coupled to a first current source, and a second transistor having a control terminal coupled to an inverse of the input voltage, a first input/output terminal coupled to the first scaling factor stage, and a second input/output terminal coupled to a second current source, wherein the impedance $Z_1$ is coupled between the second input/output terminals of the first and second transistors in the first input stage;
the second input stage comprises two transistors, a first transistor having a control terminal coupled to a voltage, a first input/output terminal coupled to the first scaling factor stage, and a second input/output terminal coupled to a first current source and a second transistor having a control terminal coupled to an inverse of the voltage, a first input/output terminal coupled to the first scaling factor stage, and a second input/output terminal coupled to a second current source, wherein the impedance $Z_2$ is coupled between the second input/output terminals of the first and second transistors in the second input stage.

9. The apparatus of claim 5, wherein:
the first scaling factor stage comprises current steering devices configured to respond to first and second voltages input to the first scaling factor stage by steering an amount of output current that toward the impedance $Z_1$; and
the second scaling factor stage comprises current steering devices configured to respond to first and second voltages input to the second scaling factor stage by steering an amount of output current that toward the impedance $Z_2$.

10. The apparatus of claim 9, wherein:
the current steering devices in the first scaling factor stage comprise two sets of differential structures comprising two transistors, wherein each set comprises:
a first transistor having a control terminal coupled to the first voltage and a first input/output terminal coupled to a transformer or balun;
a second transistor having a control terminal coupled to the second voltage and a first input/output terminal coupled to a supply voltage;
second input/output terminals of the first and second transistors are coupled together;
the second input/output terminals of a first one of the sets is coupled to a first input to the first input stage; and
the second input/output terminals of a second one of the sets is coupled to a second input to the first input stage; and
the current steering devices in the first scaling factor stage comprise two sets of differential structures comprising two transistors, wherein each set comprises:
a first transistor having a control terminal coupled to the first voltage and a first input/output terminal coupled to a transformer or balun;
a second transistor having a control terminal coupled to the second voltage and a first input/output terminal coupled to a supply voltage;
second input/output terminals of the first and second transistors are coupled together;
the second input/output terminals of a first one of the sets is coupled to a first input to the first input stage; and
the second input/output terminals of a second one of the sets is coupled to a second input to the first input stage.

11. An apparatus comprising:
a phased array system, comprising:
multiple sets of tunable delay elements, the sets comprising at least one active delay element and at least one passive delay element, wherein the at least one active delay element provides a first set of resolutions, and the passive delay element provides a second set of resolutions, a number of the first set being less than a number of the second set, wherein an active delay element comprises:
  first circuitry comprising a first input stage and first scaling factor stage, the first input stage outputting to the first scaling factor stage, wherein the first scaling factor stage adjusts a first scaling factor based on inputs to the first scaling factor stage;
  second circuitry comprising a second input stage and a second scaling factor stage, the second input stage outputting to the second scaling factor stage, wherein the second scaling factor stage adjusts a first scaling factor based on inputs to the second scaling factor stage; and
  an adder adding outputs from the first and second scaling factor stages and producing an output for the active delay element,
  wherein adjusting the inputs to the first and second scaling factor stages selects an individual one of the first set of resolutions; and
control circuitry coupled to the phased array system and configured to select and set delays for the at least one active delay element, at least by using the inputs to the first and second scaling factor stages, and delays for the at least one passive delay element for the multiple sets of tunable delay elements.

12. The apparatus of claim 11, wherein:
the first input stage comprises an impedance $Z_1$;
the second input stage comprises an impedance $Z_2$;
$Z_1$ and $Z_2$ are impedances that control one or more of a delay, a direct current gain, or input impedance for the active delay element.

13. The apparatus of claim 12, wherein the first and second scaling factor stages are configured to perform current steering toward a respective one of the impedance $Z_1$ or the impedance $Z_2$ via adjustment of respective first voltages for the first and second scaling factor stages, and wherein the active delay element is configured based on the impedances $Z_1$ and $Z_2$ and operation of the current steering to enable a phase versus frequency characteristic in the active delay element in response to a second voltage being applied to the first and second input stages, the second voltage corresponding to a signal to be delayed.

14. The apparatus of claim 12, wherein impedance $Z_1$ is a resistor and impedance $Z_2$ is an inductor.

15. The apparatus of claim 12, wherein:
the first scaling factor stage comprises current steering devices configured to respond to first and second voltages input to the first scaling factor stage by steering an amount of output current that toward the impedance $Z_1$; and
the second scaling factor stage comprises current steering devices configured to respond to first and second voltages input to the second scaling factor stage by steering an amount of output current that toward the impedance $Z_2$.

16. The apparatus of claim 11, wherein the at least one active delay element comprises a plurality of active delay elements for the sets of tunable delay elements, and the control circuitry is configured to perform a calibration process for at least two of the sets of tunable delay elements, the calibration process comprising:
  the control circuitry setting all of the active delay elements except an n-th active delay element in a first one of the sets to a first phase, setting the passive delay element in that set to the first phase, and setting the n-th active delay element in that set to a second phase;
  the control circuitry setting all of the active delay elements in a second one of the sets to the first phase, and setting the passive delay element in that set to the second phase;
  the control circuitry detecting a phase difference between outputs of the first and second sets of tunable delay elements, and adjusting the first and second inputs to the first and second scaling factor stages of the n-th active delay element until the phase difference meets a criterion; and
  the control circuitry storing one or more codes indicative of the first and second inputs for the n-th active delay element as a calibration point.

17. The apparatus of claim 16, wherein there are N active delay elements in the first set of tunable delay elements, and the calibration process further comprises:
  the control circuitry comprises performing, for each of the N active delay elements in the first set of tunable delay elements, the following: the setting all of the active delay elements except the n-th active delay element in the first set to the first phase and setting the n-th active delay element in that set to the second phase, the detecting the phase difference between outputs of the first and second sets of tunable delay elements, the adjusting the first and second inputs and the storing,
  wherein calibration points are stored for each of the N active delay elements in the first set of tunable delay elements.

18. The apparatus of claim 17, wherein the adjusting the first and second inputs to the first and second scaling factor stages of the n-th active delay element until the phase difference meets a criterion comprises:
  the control circuitry setting a constant bias to the first and second inputs;
  the control circuitry setting a code corresponding to an amount of bias added to or subtracted from the constant bias, wherein a total bias for the first and second inputs is the constant bias added to a bias corresponding to the code, wherein the calibration point comprises the code.

19. The apparatus of claim 18, wherein the code corresponds to a change in voltage, $\Delta V$, the first input is a voltage, $V_1$, the second input is a voltage, $V_2$, $V_1=V_0+\Delta V$ and $V_2=V_0-\Delta V$, where $V_0$ is a bias voltage that supports a quiescent operation.

20. The apparatus of claim 17, wherein the first and second scaling factor stages have corresponding scaling factors $\alpha$ and $\beta$, and wherein the calibration process further comprises:
  performing the calibration process for each of the N active delay elements in the first set of tunable delay elements, for multiple different frequencies, yielding calibration points for each of the N active delay elements over the multiple different frequencies; and
  performing a least mean square (LMS) algorithm, using at least the calibration points for each of the N active delay elements over the multiple different frequencies, to determine the scaling factors $\alpha$ and $\beta$ so that corresponding active delay elements are optimized to operate over a selected frequency range so that delays for the active delay elements are realized accurately.

21. A method, comprising:
performing a calibration process on a phased array system, the phased array system comprising multiple sets of tunable delay elements, the sets comprising at least one active delay element and at least one passive delay element, wherein the at least one active delay element provides a first set of resolutions, and the passive delay element provides a second set of resolutions, wherein a number of the first set is less than a number of the second set, and wherein the calibration process comprises:
- setting all of the active delay elements except an n-th active delay element in a first one of the sets to a first phase, setting the passive delay element in that set to the first phase, and setting the n-th active delay element in that set to a second phase;
- setting all of the active delay elements in a second one of the sets to the first phase, and setting the passive delay element in that set to the second phase;
- detecting a phase difference between outputs of the first and second sets of tunable delay elements, and adjusting the first and second inputs to the first and second scaling factor stages of the n-th active delay element until the phase difference meets a criterion; and
- storing one or more codes indicative of the first and second inputs for the n-th active delay element as a calibration point.

22. The method of claim 21, wherein there are N active delay elements in the first set of tunable delay elements, and the calibration process further comprises:
- performing, for each of the N active delay elements in the first set of tunable delay elements, the following: the setting all of the active delay elements except the n-th active delay element in the first set to the first phase and setting the n-th active delay element in that set to the second phase, the detecting the phase difference between outputs of the first and second sets of tunable delay elements, the adjusting the first and second inputs and the storing,
- wherein calibration points are stored for each of the N active delay elements in the first set of tunable delay elements.

23. The method of claim 22, wherein the adjusting the first and second inputs to the first and second scaling factor stages of the n-th active delay element until the phase difference meets a criterion comprises:
- setting a constant bias to the first and second inputs; and
- setting a code corresponding to an amount of bias added to or subtracted from the constant bias, wherein a total bias for the first and second inputs is the constant bias added to a bias corresponding to the code, wherein the calibration point comprises the code.

24. The method of claim 23, wherein the code corresponds to a change in voltage, $\Delta V$, the first input is a voltage, $V1$, the second input is a voltage, $V2$, $V1=V0+\Delta V$ and $V2=V0-\Delta V$, where $V0$ is a bias voltage that supports a quiescent operation.

25. The method of claim 22, wherein the first and second scaling factor stages have corresponding scaling factors $\alpha$ and $\beta$, and wherein the calibration process further comprises:
- performing the calibration process for each of the N active delay elements in the first set of tunable delay elements, for multiple different frequencies, yielding calibration points for each of the N active delay elements over the multiple different frequencies; and
- performing a least mean square (LMS) algorithm, using at least the calibration points for each of the N active delay elements over the multiple different frequencies, to determine the scaling factors $\alpha$ and $\beta$ so that corresponding active delay elements are optimized to operate over a selected frequency range so that delays for the active delay elements are realized accurately.

\* \* \* \* \*